(12) United States Patent
Yi

(10) Patent No.: US 7,734,002 B2
(45) Date of Patent: Jun. 8, 2010

(54) PHASE DIFFERENCE DETECTOR HAVING CONCURRENT FINE AND COARSE CAPABILITIES

(75) Inventor: Li Yi, Shanghai (CN)

(73) Assignee: Integrated Device Technology, inc., San Jose, CA (US)

( * ) Notice: Subject to any disclaimer, the term of this patent is extended or adjusted under 35 U.S.C. 154(b) by 817 days.

(21) Appl. No.: 11/599,895

(22) Filed: Nov. 14, 2006

(65) Prior Publication Data
US 2008/0112526 A1 May 15, 2008

(51) Int. Cl.
*H03D 3/24* (2006.01)
(52) U.S. Cl. .................. 375/376; 327/156; 331/25
(58) Field of Classification Search ........... 375/376; 327/156; 331/25
See application file for complete search history.

(56) References Cited

U.S. PATENT DOCUMENTS

| | | | | |
|---|---|---|---|---|
| 5,191,336 A | * | 3/1993 | Stephenson | 341/111 |
| 5,398,263 A | * | 3/1995 | Vanderspool et al. | 375/376 |
| 5,708,395 A | * | 1/1998 | Yamauchi et al. | 331/1 A |
| 6,067,039 A | * | 5/2000 | Pyner et al. | 342/125 |
| 6,304,623 B1 | * | 10/2001 | Richards et al. | 375/355 |
| 6,483,389 B1 | | 11/2002 | Lamb | |
| 6,489,824 B2 | * | 12/2002 | Miyazaki et al. | 327/158 |
| 6,525,578 B2 | | 2/2003 | Ooishi | |
| 6,774,694 B1 | * | 8/2004 | Stern et al. | 327/276 |
| 6,819,117 B2 | * | 11/2004 | Wilsher | 324/601 |
| 6,937,076 B2 | * | 8/2005 | Gomm | 327/158 |
| 7,028,207 B2 | * | 4/2006 | Gomm | 713/401 |
| 7,215,584 B2 | * | 5/2007 | Butt et al. | 365/193 |
| 7,221,724 B2 | * | 5/2007 | Schell | 375/355 |

OTHER PUBLICATIONS

Tabatabaei, "Jitter generation and measurement for test of multi-Gbps serial IO", ITC 2004, International Test Conference, 2004. Proceedings, 2004 pp. 1313-1321.*
Song, "A delay locked loop circuit with mixed-mode tuning", ASICs, 1999, AP-ASIC '99, The First IEEE Asia Pacific Conference on Aug. 23-25, 1999 pp. 347-350.*
Arai, "A high-resolution time digitizer utilizing dual PLL circuits", 2004 IEEE Nuclear Science Symposium Conference Record, vol. 2, Oct. 16-22, 2004 pp. 969-973 vol. 2.*

* cited by examiner

*Primary Examiner*—Juan A Torres
(74) *Attorney, Agent, or Firm*—Tracy Parris

(57) ABSTRACT

A phase difference detector having concurrent fine and coarse capabilities synchronizes operations of coarse and fine phase detectors. In one embodiment, clusters of fine timing markers are generated by delay stages of a delay locked loop. The K'th one of every cluster of J fine timing markers is designated as a coarse marker. A first timer determines which of J fine markers in a first cluster is closest to a rising edge of a reference signal. A second timer determines which of J fine markers in a second cluster is closest to a rising edge of a follower signal. A third timer determines how many coarse markers separate the rising edges of the reference and follower signals. Temporal displacement values obtained from the determinations of the first though third timers are combined to produce a phase displacement measurement signal of broad range and high precision across its operating range.

42 Claims, 16 Drawing Sheets

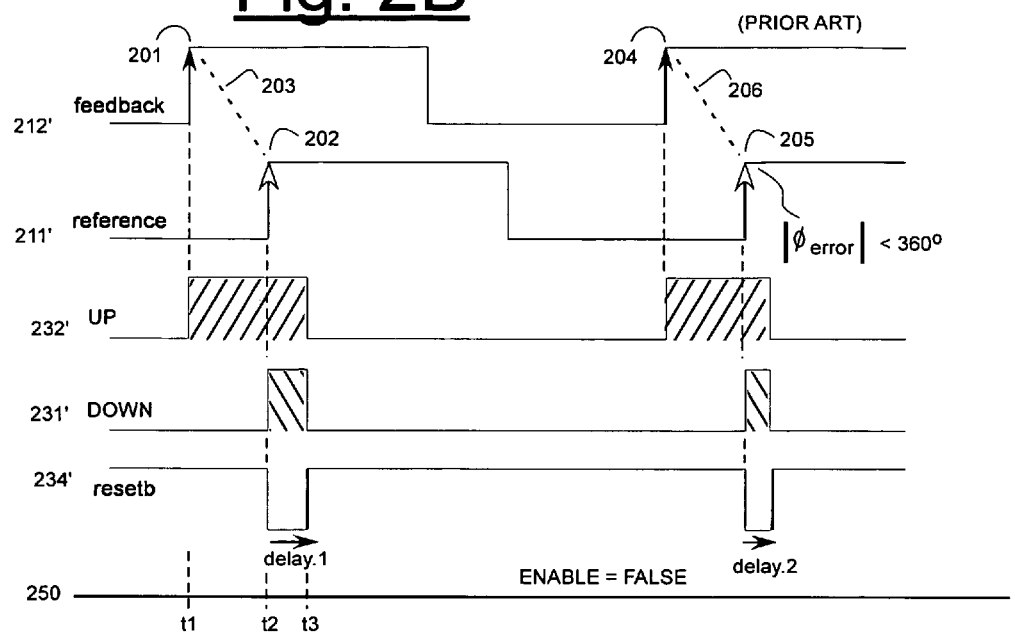
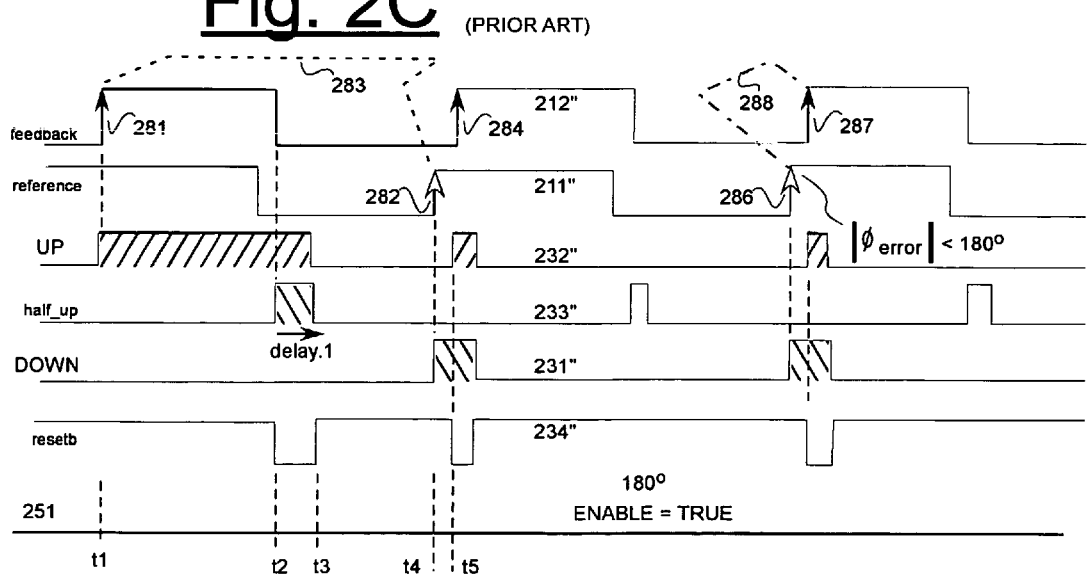

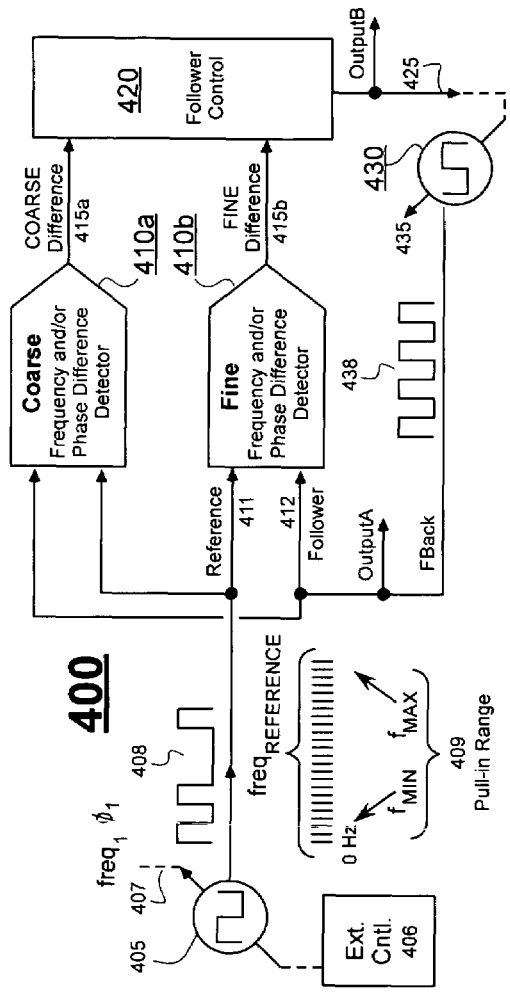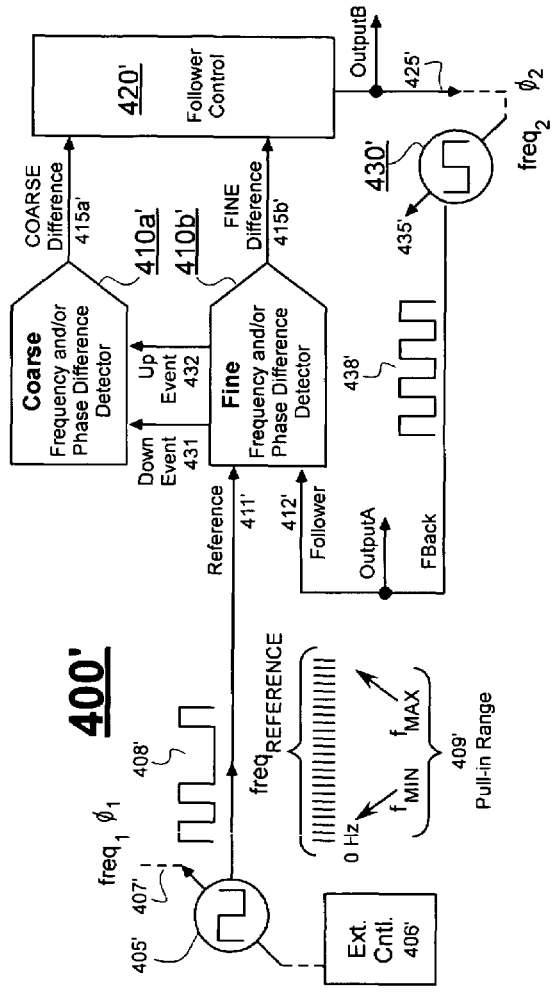
Fig. 4A
Fig. 4B

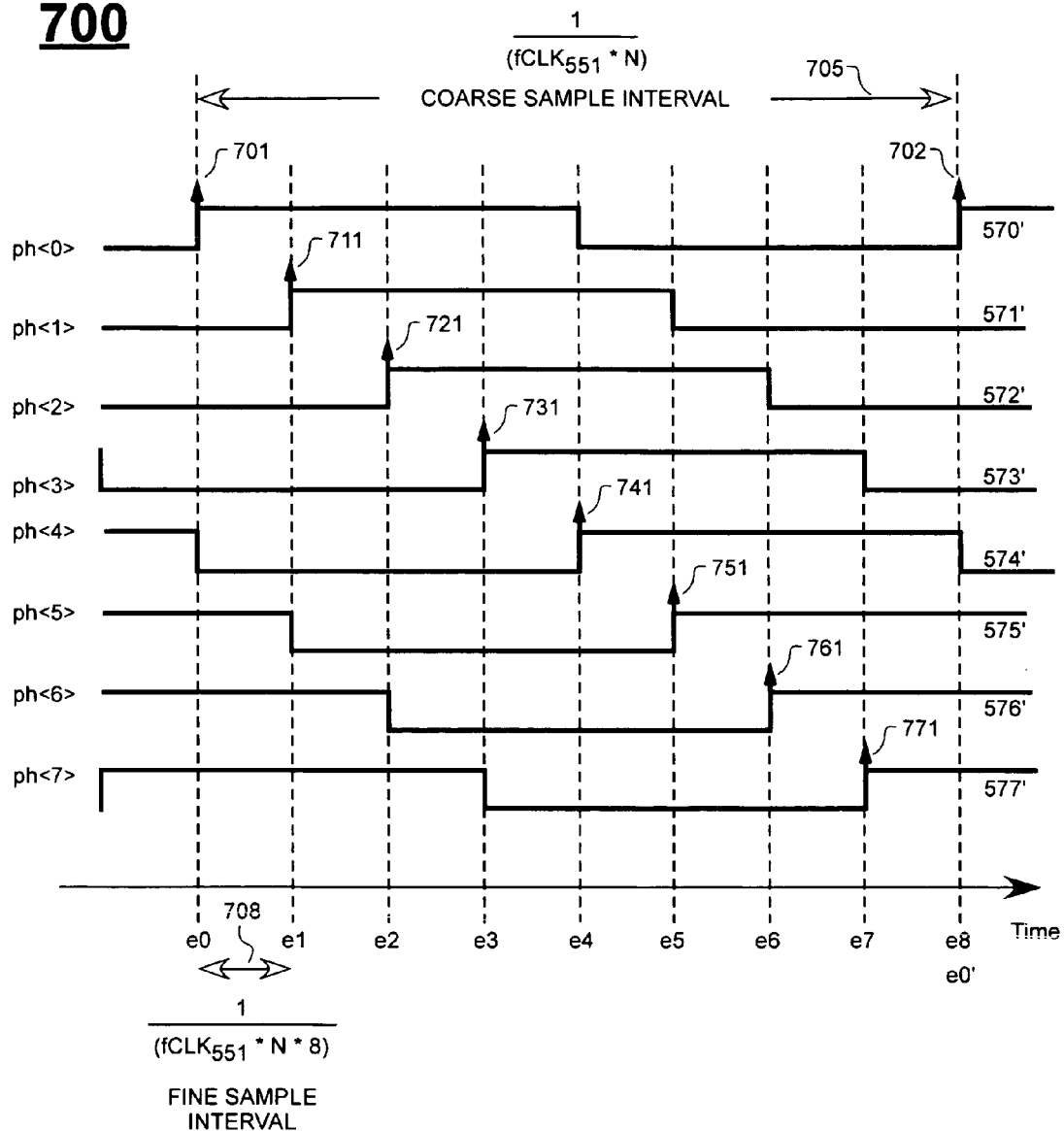

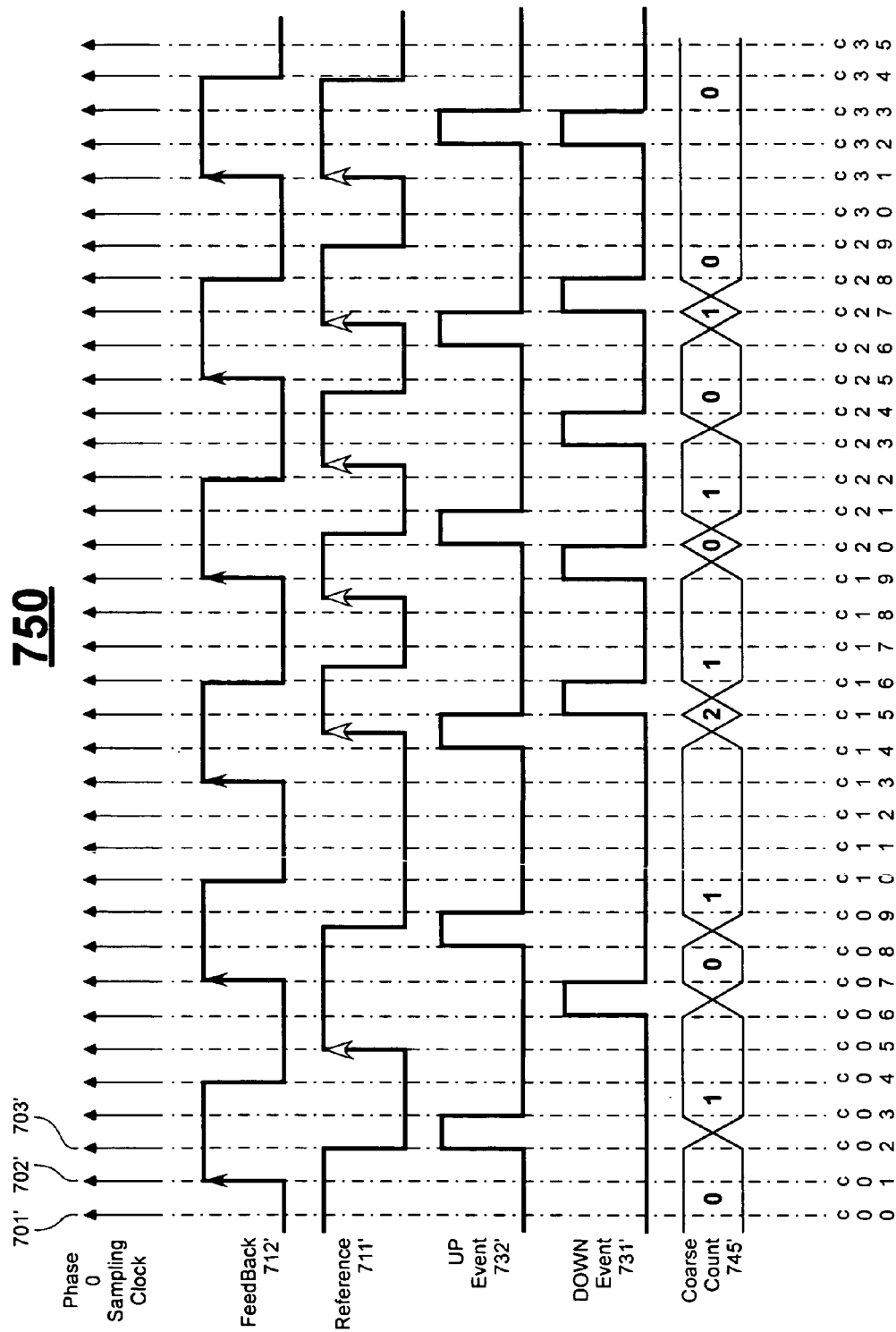

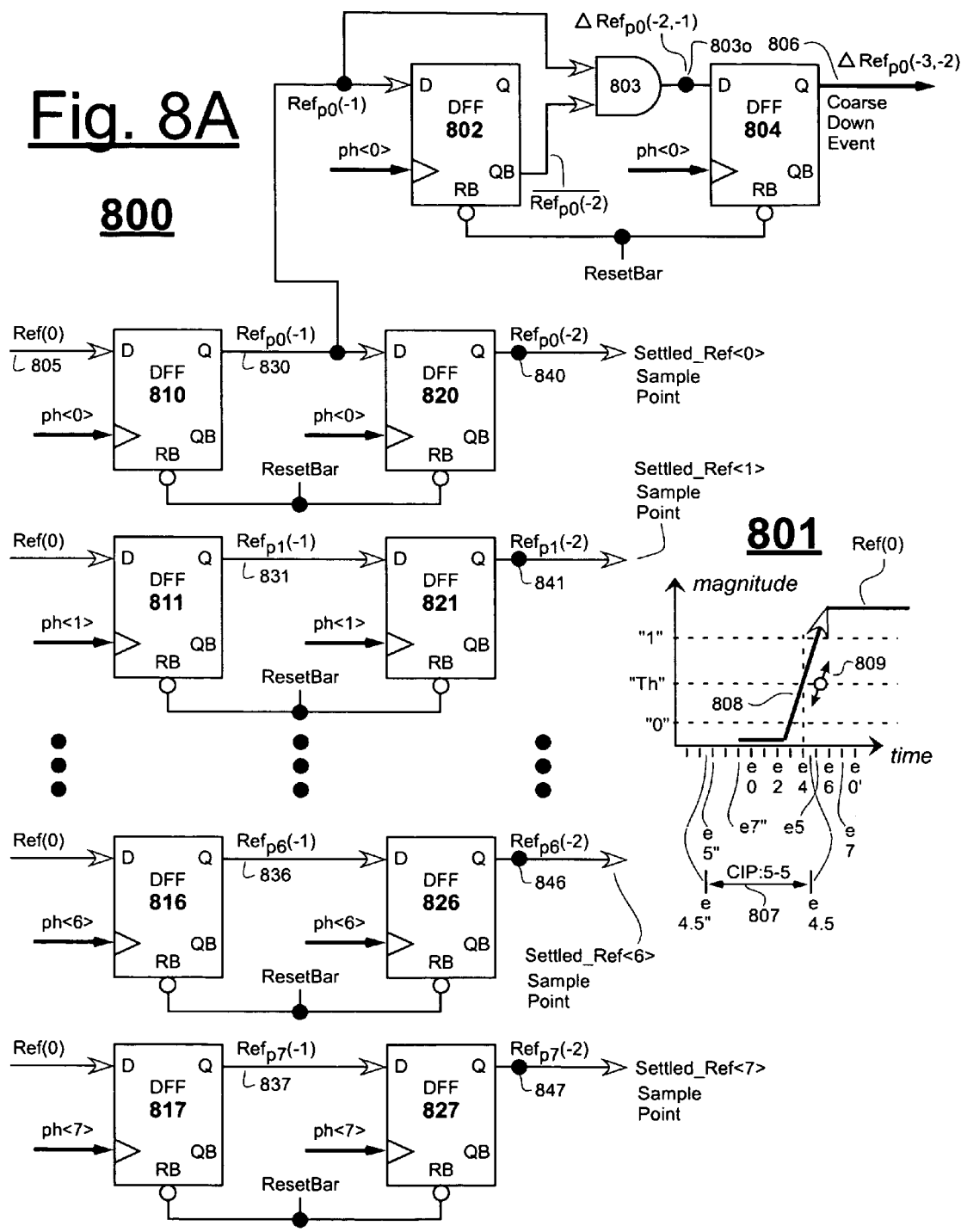

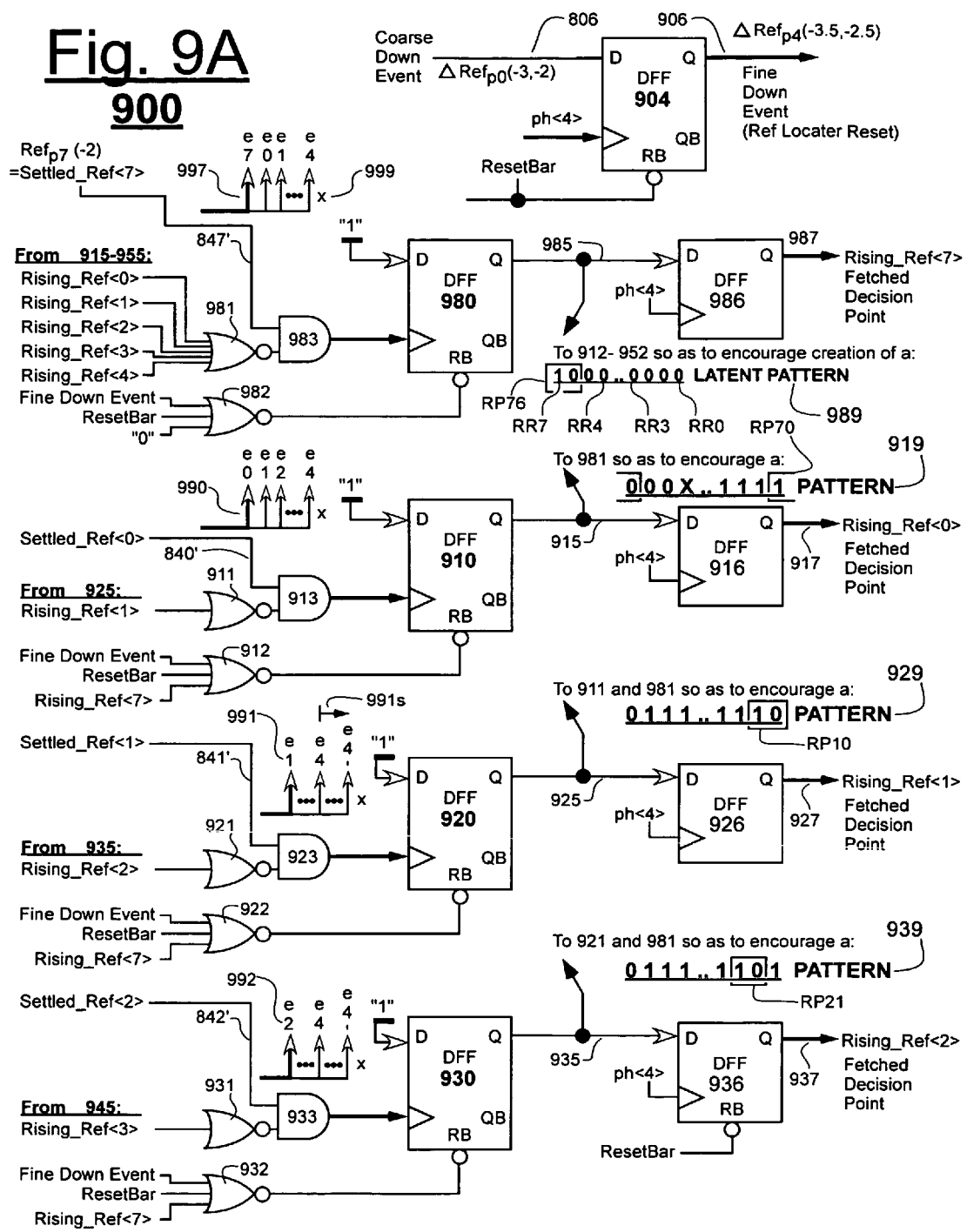

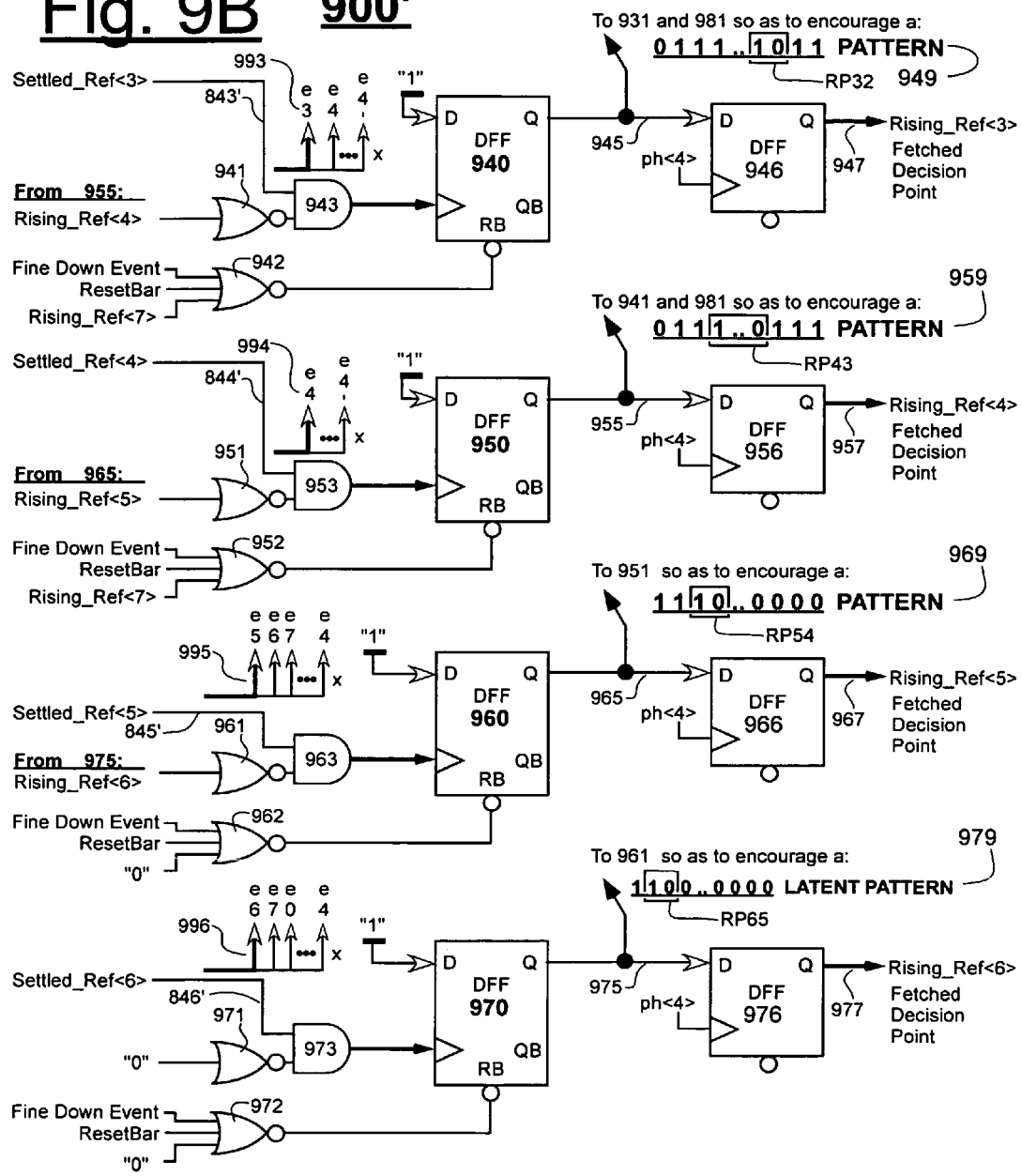

1000

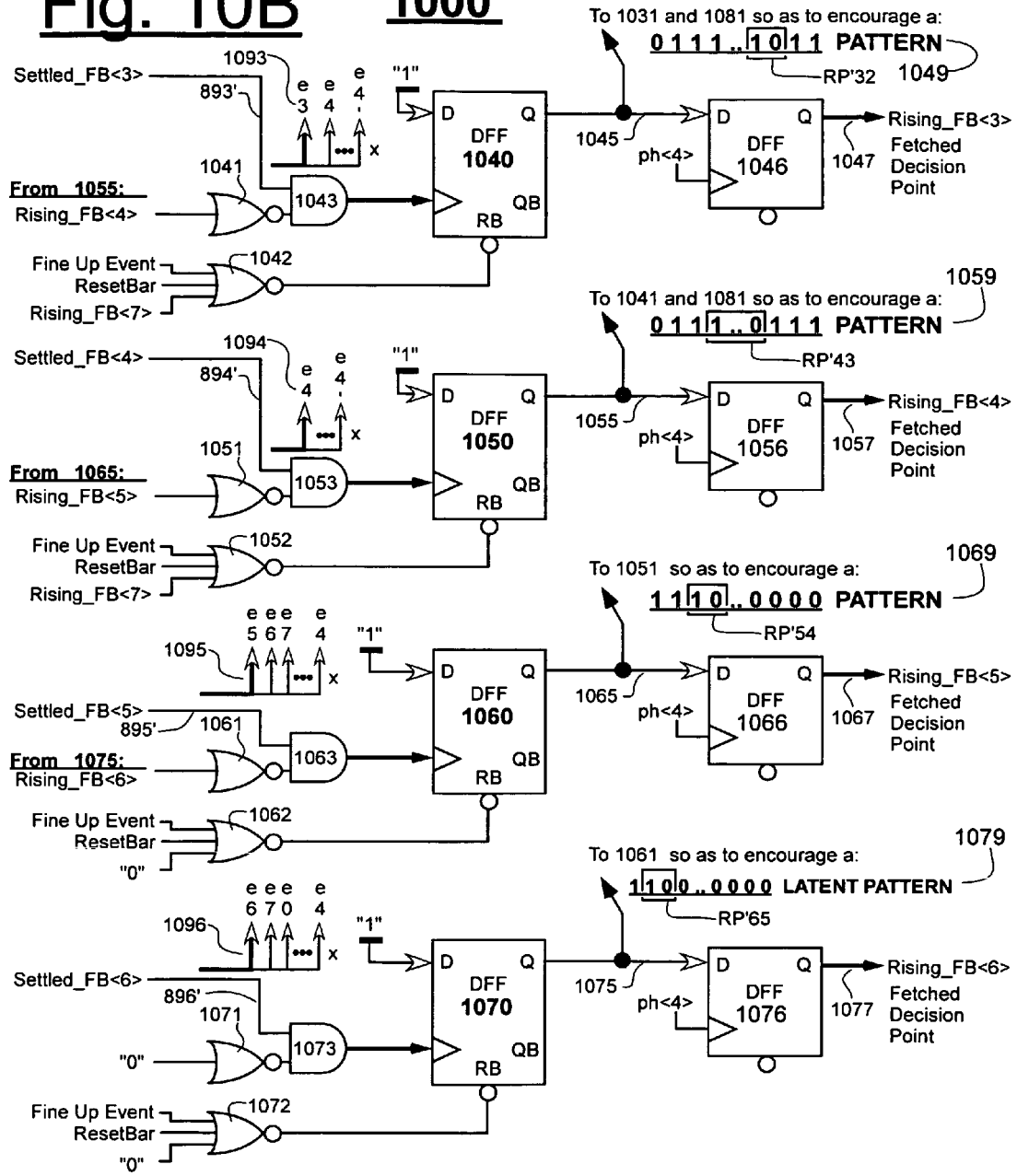

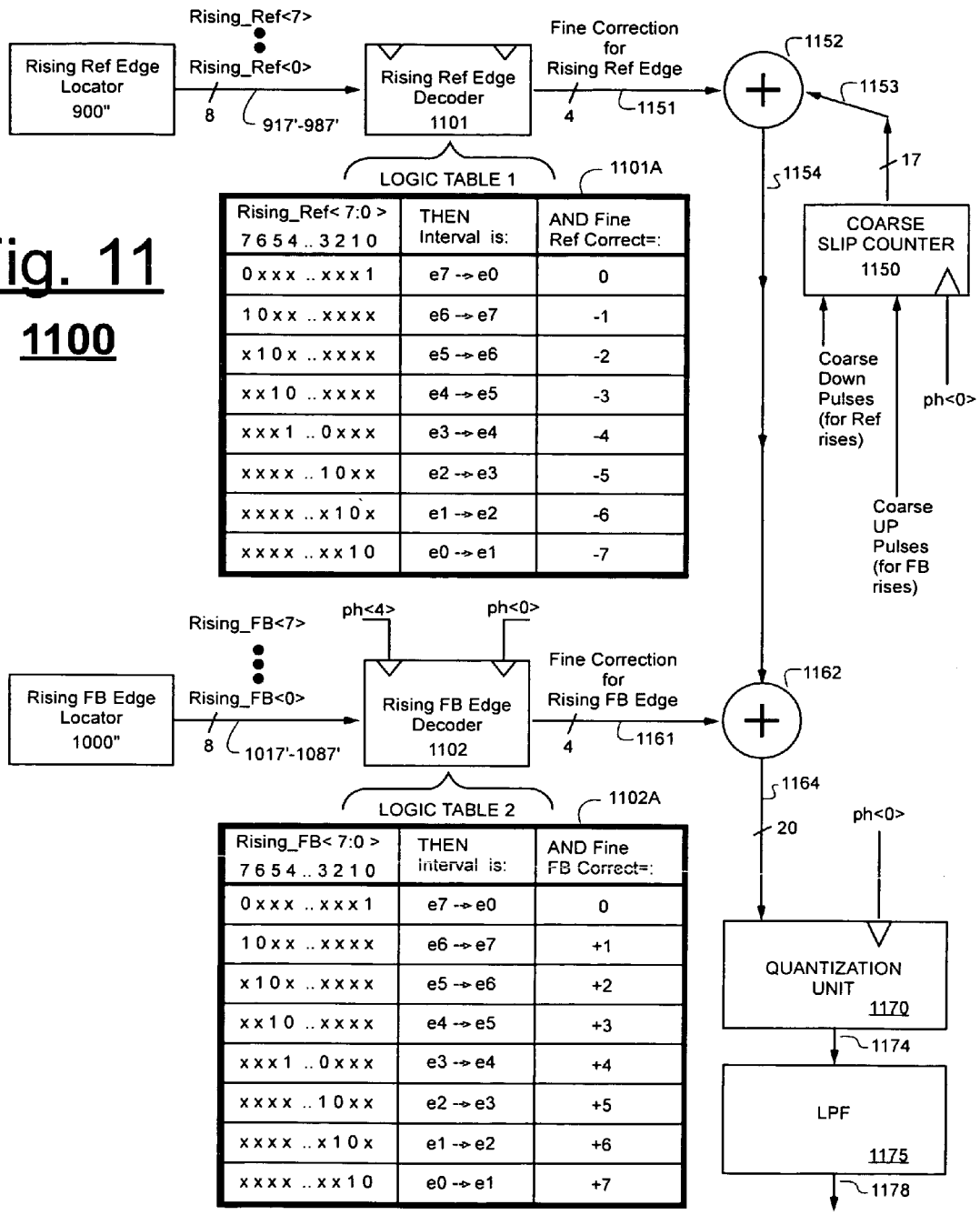

1200

PHASE DIFFERENCE DETECTOR HAVING CONCURRENT FINE AND COARSE CAPABILITIES

FIELD OF DISCLOSURE

The present disclosure of invention relates generally to measurement of timing difference such as occurs in detectors of frequency and/or phase difference.

DESCRIPTION OF RELATED ART

Frequency and/or phase detectors find use in a wide range of applications. By way of a first example, in serial data communication systems it is common to embed a recoverable digital clock signal in a serialized data stream and to generate a phase locked facsimile of the embedded clock signal at a receiving node. The facsimile clock signal is expected to closely track (follow) the frequency and phase of the embedded clock signal despite variations in frequency and/or phase over time. In terms of a second example, some telemetry systems provide information through use of phase shifting modulation. The amount of phase shift can be large or small depending on conditions.

A first common design for phase detectors (the asynchronous edge detect approach) is able to detect very fine differences in phase (up to a practical, but possibly variable, lower limit) and is thus useful in keeping the facsimile or "following" signal tightly in phase with the to-be-tracked or "reference" signal. Tight tracking can be provided so long as the reference signal does not change too quickly in phase or frequency and remains within a small pull-in range. The asynchronous approach is unable to detect large differences in phase (those equal to and greater than the unit interval or period of the following signal). It may begin to provide erroneous or misleading measurements when phase and/or frequency change by relatively large increments. An example of the asynchronous approach may be found in U.S. Pat. No. 6,483,389 (issued to Lamb Nov. 19, 2002).

A second commonly used design for phase detectors (the synchronous edge detect approach) is able to detect coarse differences of phase between the reference signal and the following signal but the approach runs into problems when the phase difference drops below a sampling period of the synchronous detector. Also, the synchronous edge detect approach suffers from an inherent quantization error problem.

Some applications call for a phase/frequency difference detector that has a relatively large pull-in range and yet can also provide close tracking of the reference signal. This presents problems for both of the above-mentioned, conventional phase detectors because the reference signal can change in phase or frequency fairly quickly and by large increments; thus leaving the asynchronous edge detecting approach (first approach) unable to cope when the phase difference exceeds the unit interval limit (the upper measurement bound of the asynchronous approach). At the same time it leaves the synchronous approach (second approach) unable to cope with the desire for very close tracking of the reference signal by the follower signal after the latter comes into a proximity with the former that is shorter than the sampling period of the working clock of the synchronous approach. And as already mentioned, the synchronous approach is plagued by an inherent quantization error problem that arises from the sampling period of the working clock not being sufficiently small to sample fine phase differences.

SUMMARY

In accordance with one aspect of the present invention, a common time frame (a chronological ruler) is established for use in making measurements of coarse phase differences and also of fine phase differences. The common time frame is formed as a plurality of coarse time markers and repeated sets or clusters of fine time markers, with each cluster of fine markers being aligned to, or synchronized to a respective one of the coarse markers so that the clusters provide consistent, fine offset measurements extending apart from their respective coarse markers; with the offset measurements being made either in a region following the respective coarse marker, or a region preceding it, or a region surrounding the respective coarse marker. In one embodiment, spacings between the fine markers are set to correspond to an invariant frequency standard (e.g., a temperature invariant crystal oscillator) so that an invariable precision of fine measurement is established over the measurement domain of the chronological ruler for a given, predefined range of environmental operating parameters (i.e., a predefined range of operating temperatures).

In one embodiment, the coarse time markers are used for counting out a coarse phase difference. The associated fine phase markers are used to almost-concurrently measure fine offsets between respective coarse markers and associated edges of respective first and second switched signals (i.e., a reference signal and a follower signal). In one embodiment, the common time frame is formed by a plurality of slightly out of phase, but essentially identical clock signals. Edges of one of the clock signals (i.e., the phase<0> clock as described below) serve as the coarse markers while edges of others of the out-of-phase clock signals serve as adjacent fine markers. In one embodiment, the plurality of out-of-phase, but otherwise essentially identical clock signals are generated by a delay locked loop (DLL) that is phase locked to an invariant working clock such as one generated by a crystal oscillator.

A phase detector in accordance with the disclosure comprises: (a) a fine phases generator for generating a plurality of finely out-of-phase, clock signals; (b) a first fine edge locater for determining a first fine phase relation between a supplied reference signal and the plurality of finely out-of-phase clock signals; (c) a second fine edge locater for determining a second fine phase relation between a produced follower signal (feedback signal) and the plurality of finely out-of-phase, clock signals; (d) a fine difference determiner, responsive to the first and second fine edge locaters and providing an indication of a fine phase difference associated with the reference and follower signals as measured relative to a common timing frame established by the out-of-phase clock signals; (e) a coarse difference determiner, operating overlappingly-in-time with, and in synchronism with the fine edge locaters and providing an indication of a coarse phase difference between edges of the reference and follower signals as measured relative to the common time frame established by the out-of-phase clock signals so that the coarse phase difference indication aligns with the measurement frame of the fine phase difference indication, thereby allowing the two to be combined to provide a more accurate, integrated phase difference indication.

A phase detecting method in accordance with the disclosure comprises: (a) generating a plurality of finely out-of-phase clock signals; (b) first determining a first fine phase relation between a supplied reference signal and the plurality of finely out-of-phase clock signals; (c) second determining a second fine phase relation between a supplied follower signal (feedback signal) and the plurality of finely out-of-phase clock signals; (d) generating a coarse phase difference indication that is synchronized with the first and second fine phase relationship determinations of steps (b) and (c) where the coarse phase difference indication indicates a magnitude of coarse phase difference between the reference and follower signals, the coarse phase difference, if not zero, being substantially greater in magnitude than phase differences between the finely out-of-phase clock signals; and (e) combining the coarse phase difference indication with the first and second fine phase relation to thereby produce an integrated phase indication that is more accurate and more precise than the coarse phase difference indication taken alone.

Other aspects of the disclosure will become apparent from the below detailed description.

BRIEF DESCRIPTION OF THE DRAWINGS

The below detailed description section makes reference to the accompanying drawings, in which:

FIGS. 2B and 2C are timing diagrams showing operations of the asynchronous detector of FIG. 2A when respectively in a <360° detecting mode and in a <180° detecting mode;

FIG. 4A is a block diagram of a first control loop system containing fine and coarse frequency and/or phase difference detectors;

FIG. 4B is a block diagram of a second control loop system containing fine and coarse frequency and/or phase difference detectors, where the coarse detector is synchronized with the fine detector;

FIG. 7A is a timing diagram for one embodiment of the DLL of FIG. 5 that has eight essentially identical delay stages;

FIG. 7B is a timing diagram for one embodiment of the course phase difference detector of FIG. 5;

FIGS. 8A-8B combine to provide a schematic of one embodiment of the sample logger and stabilizer of FIG. 6;

FIGS. 9A-9B combine to provide a schematic of one embodiment of the rising reference edge locater portion of unit 610B of FIG. 6;

FIGS. 10A-10B combine to provide a schematic of one embodiment of the rising follower (or feedback) edge locater portion of unit 610B of FIG. 6;

FIG. 11 is a schematic showing one embodiment of the position decoder and exporter of FIG. 6.

DETAILED DESCRIPTION

Figure 1:
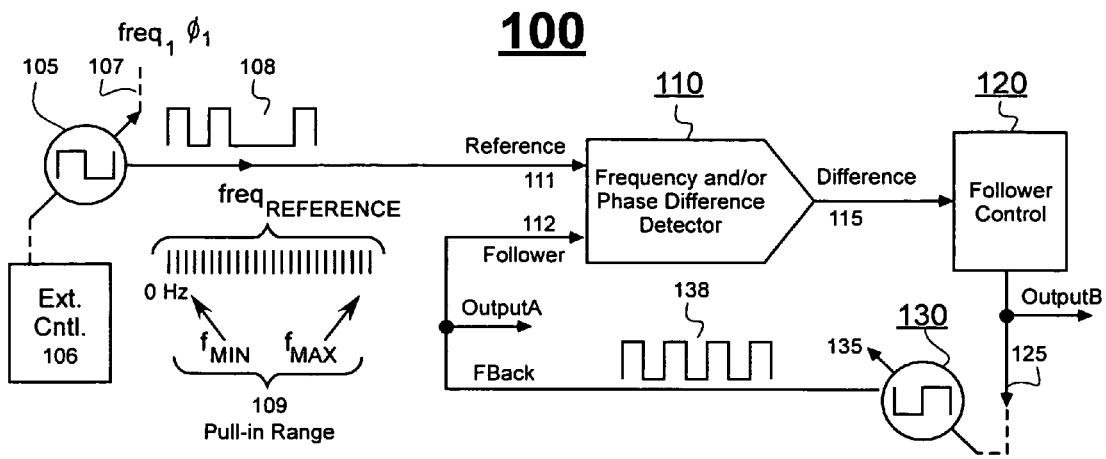
FIG. 1 is a block diagram of a control loop containing a frequency and/or phase difference detector.

FIG. 1 shows a block diagram of a phase and/or frequency locking system 100 that employs a generic frequency and/or phase difference detector 110. Detector 110 produces a difference signal 115 representative of a frequency and/or phase difference between a supplied reference signal 111 and a locally-generated, follower signal 112. The follower signal 112 (also referred to at times as the feedback signal) is expected to follow the reference in terms of changing phase and/or frequency.

Reference signal 111 may be supplied from any of a variety of different kinds of sources 105. The sources 105 may be susceptible to intentional and/or random changes of frequency ($freq_1$) and/or phase ($\phi_1$). The waveform 108 of the reference signal may be a regular square wave or an irregular pulse stream that is provided with or without jitter or other forms of noise. By way of a non-limiting example, waveform 108 may be an embedded clock signal recovered from a serial data stream and structured for generating a corresponding and regular synchronization clock signal (138) at a signal-receiving node. The phase and/or frequency of the embedded clock signal may shift randomly due to temperature or other environmental changes. Alternatively, the reference signal 111 may be one whose phase and/or frequency change intentionally for the purpose of signaling certain types of information (i.e. telemetry data). By way of example, an external control 106 may be provided or controlling a frequency and/or phase control portion 107 of the reference source 105 so as to indicate change in a physically measured attribute (i.e., temperature in a chemical process chamber as relayed by telemetry). In such a case, the combination of control 106 and source 105 may define a physical measurement sensor, and the desired output (OutputB) of the loop system 100 may be a precise indication 125 ($freq_2$ and/or $\phi_2$) of the reference signal frequency and/or phase rather than an output (OutputA) of the follower signal 112 itself.

Irrespective of whether the changes in frequency and/or phase of the reference signal 111 are intentional or otherwise, the phase and/or frequency locking system 100 includes a variable pulse generator 130 whose frequency and/or phase and/or pulse widths are variable as is indicated by control element 135 and its operative connection to the control/indication line 125 ($freq_2$ and/or $\phi_2$) of the follower control block. The output 138 of variable pulse generator 130 constitutes the follower signal 112 that is intended to track the source reference signal 111 both in phase and in fundamental frequency. Difference detector 110 receives signals 111 and 112 as its inputs and produces a difference-indicating signal 115 as its output. The difference-indicating signal 115 couples to the follower controller 120, whose output line 125 couples (as already mentioned) to control one or both of the phase and/or frequency ($freq_2$ and/or $\phi_2$) of the variable pulse generator 130. Follower controller 120 is designed to reduce the magnitude of difference (as represented by signal 115) and to thus keep the follower signal 112 in close phase and/or frequency alignment with the reference signal 111.

Speed and precision of tracking is determined in part by design of the difference detector 110. Different kinds of phase detectors have their respective advantages and drawbacks as shall be detailed shortly. Tracking speed and precision is also determined by design of the follower control system 120 and the pulse generator 130 which together with unit 110 form a closed control loop (110-120-130) with finite loop delay. Typically, there will be a pre-defined pull-in range 109 for the system that designates a minimum and maximum frequency ($f_{MIN}$, $f_{MAX}$) over which the difference detector 110 is expected to operate. In some instances the specified pull-in range 109 may be very wide, with its minimum frequency ($f_{MIN}$) being very close to DC (0 Hz) and its maximum frequency ($f_{MAX}$) being in the megahertz range or higher. Users of the phase and/or frequency locking system 100 may choose to utilize one or both of the follower signal 112 and control signal 125, as indicated by the respective Output-A and Output-B terminals of FIG. 1.

Figure 2A:
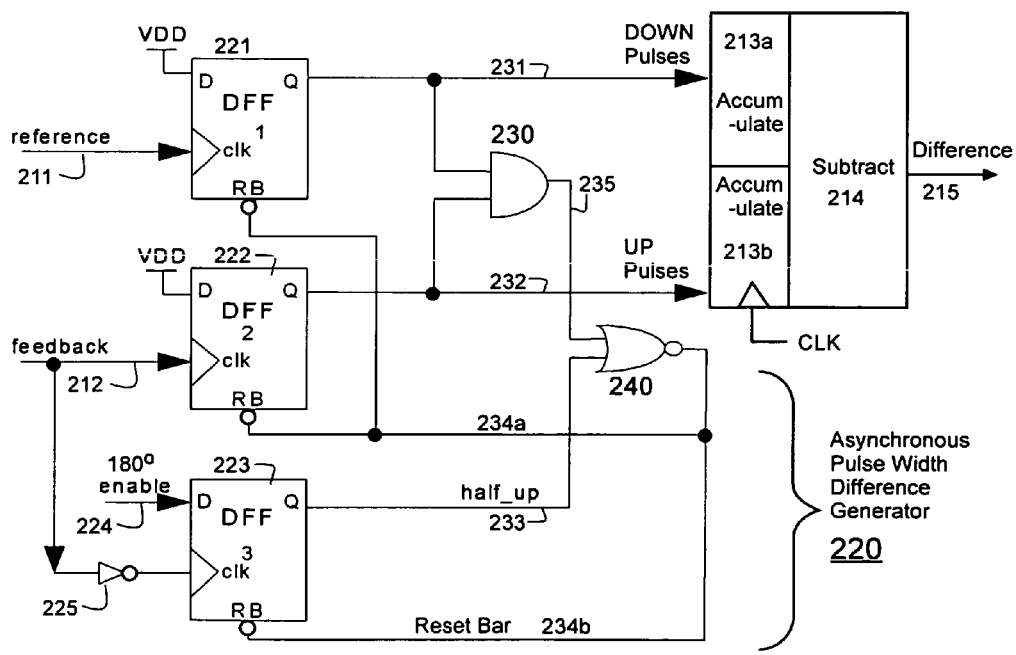
FIG. 2A is a schematic diagram of a conventional, asynchronous phase difference detector.

Referring to FIG. 2A, the basic design of a first commonly-used phase detector is shown at 200. A portion of the illustrated example 200 may be found in the above-cited, U.S. Pat. No. 6,483,389. This first design 200 may be termed an asynchronous edge detector because it is not bound to a sampling clock. Operation of the asynchronous design 200 may be better understood by simultaneous reference to the timing diagrams of FIGS. 2B and 2C. During operation, a first set of variable-width pulses are generated on a DOWN-pulses line 231 while a second set of width-modulated pulses are generated on an UP-pulses line 232. Respective pulse-width accumulators 213a and 213b accumulate respective sums of the pulse widths of their respective DOWN and UP pulse streams. Subtractor 214 then generates a corresponding difference signal 215. Design of the width accumulators 213a-213b and of the subtractor 214 may vary from application to application. The specific design is not directly pertinent to the present disclosure. Simply by way of example, each of the accumulators 213a-213b may be an analog, low pass filter (LPF) while the subtractor may be a differential analog-to-digital converter (ADC) which produces a digital difference signal 215 representing the difference between the filter-integrated analog signals. Alternatively, accumulators 213a-213b may each be a high-speed counter driven by a high-speed working clock (CLK). In the latter case, the subtractor 214 may be a digital subtraction unit. The counters are periodically reset so they do not wrap beyond their upper count limits. (These are just examples.) Smaller phase differences may be detected by increasing the integration time, but of course, this also increases the loop delay, slows the loop response time and reduces the detection bandwidth of the system. The lower detection limit of the asynchronous difference generator circuit 220 may vary from circuit to circuit and thus represents a nondeterministic bound on measurement precision. In other words, even though two or more circuits are built the same way as represented by FIG. 2A, one may be able to detect smaller phase differences than the other due to random variations in semiconductor manufacturing processes. So the fine detection performance of one such circuit is not always reliably repeated in the next such circuit.

Detailed operation of the asynchronous difference generator circuit 220 is as follows. Three D-type flip flops 221, 222 and 223 are provided as shown and respectively coupled to receive the reference signal 211, the feedback signal 212 (follower signal 212) and the inverse of the feedback signal (through inverter 225) at their respective clock input terminals. The D inputs of the flip flops are connected to logic "1" (or to the 180° Enable signal 224 in the case of third flip flop 223). The reset terminals of the three flip flops are driven by a Reset Bar signal 234b and 234a provided from NOR gate 240.

Referring to FIG. 2B and assuming that the 180° Enable signal (224) is false as shown in FIG. 2B by ENABLE=FALSE 250, the Q output (UP 232) of flip flop 222 goes high at time point t1 in response to the rising edge 201 of the feedback signal 212'. The Q output of flip flop 221 (DOWN 231) goes high in response to the rising edge 202 of the reference signal 211'. AND gate 230 detects when both of lines 231 and 232 are high. The output of AND gate 230 is signal 235, which is provided as an input to NOR gate 240. Due to propagation delay via AND gate 230, NOR gate 240 and due to response time of the flip flops to the Reset Bar line 234a and 234b shown as resetb 234' in FIG. 2B going low, the first and second flip flops (221, 222) do not reset until a slightly delayed third time point t3 following the time t2 when the rising edge 202 of the reference signal appeared. It may be seen from FIG. 2B that the difference in pulse widths between the UP pulses 232' and the DOWN pulses 231' represents the phase difference 203 between the respective leading edges 201, 204 of the feedback signal and corresponding leading edges 202, 205 of the reference signal. The measured phase difference (e.g., 206) remains substantially the same even if the amount of delay (delay.1 and delay.2) for responding to UP and DOWN varies from time to time. Analysis of FIG. 2B will show that the absolute value of the phase error that may be detected by the circuit of FIG. 2B always remains less than one unit interval (UI) of the feedback signal 212'. In other words, $|\Phi_{error}|<360°$.

Referring to FIG. 2C, operation of the difference generator circuit 220 when the Enable line 224 is True is a little more involved but boils down to the detected phase error usually remaining at less than one half the unit interval (UI/2) of the feedback signal 212". In other words, $|\Phi_{error}|<180°$. More specifically, at time point t1 of timing line 251, it is assumed that reference 211" has remained high while the leading edge 281 of the feedback signal occurs at t2. As a result, the UP signal 232" goes high. It may be seen that the difference in pulse widths between the UP pulses 232" and the DOWN pulses 231" represents the phase difference between the respective leading edges 284, 287 of the feedback signal and corresponding leading edges 282, 286 of the reference signal. Referring to the half up signal 233 in the circuit shown in FIG. 2A, the half up signal 233" shown in the timing diagram of FIG. 2C goes high in response to the trailing edge of the feedback signal and the UP signal 232" goes low a short time later at t3. Due to propagation delay via NOR gate 240 and due to response time of the flip flops to the Reset Bar line 234a and 234b shown as resetb 234" in FIG. 2C going low, the second and third flip flops (222, 223) do not reset until a slightly delayed third time point t3 following the time t2 when the trailing edge 202 of the reference signal appeared. In the interim, the reference signal 211" has gone low. Once reference 211" has gone low, the enabled circuit 220 begins to measure not the long phase difference 283 between rising edge 281 of the feedback signal and rising edge 282 of the reference signal but rather the shorter phase difference 288 between rising edges such as 286 of the reference signal and 287 of the feedback signal. In other words, for the case where the 180° Enable terminal is pulled to True (to logic high or "1"), the absolute value of the detectable phase error for this circuit is less than 180° of half the unit interval of the feedback signal.

Referring back to FIG. 1, it may be seen that if the asynchronous design (200) of FIG. 2A alone is used for the frequency and/or phase difference detector 110, then the system 100 will experience cycle slip when the phase error increases rapidly such that rate of increase of phase exceeds the loop response time of the compensating loop (110-120-130). In such a case the Output-B signal on line 125 will be in error and the corrective command to the variable pulse generator 130 may be sending its phase and/or frequency corrections in the wrong direction.

Figure 3A:
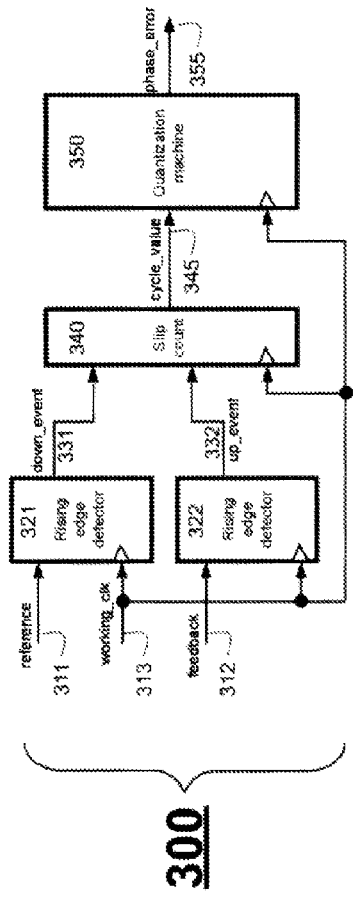
FIG. 3A is a schematic diagram of a conventional, synchronous phase difference detector.
Figure 3B:
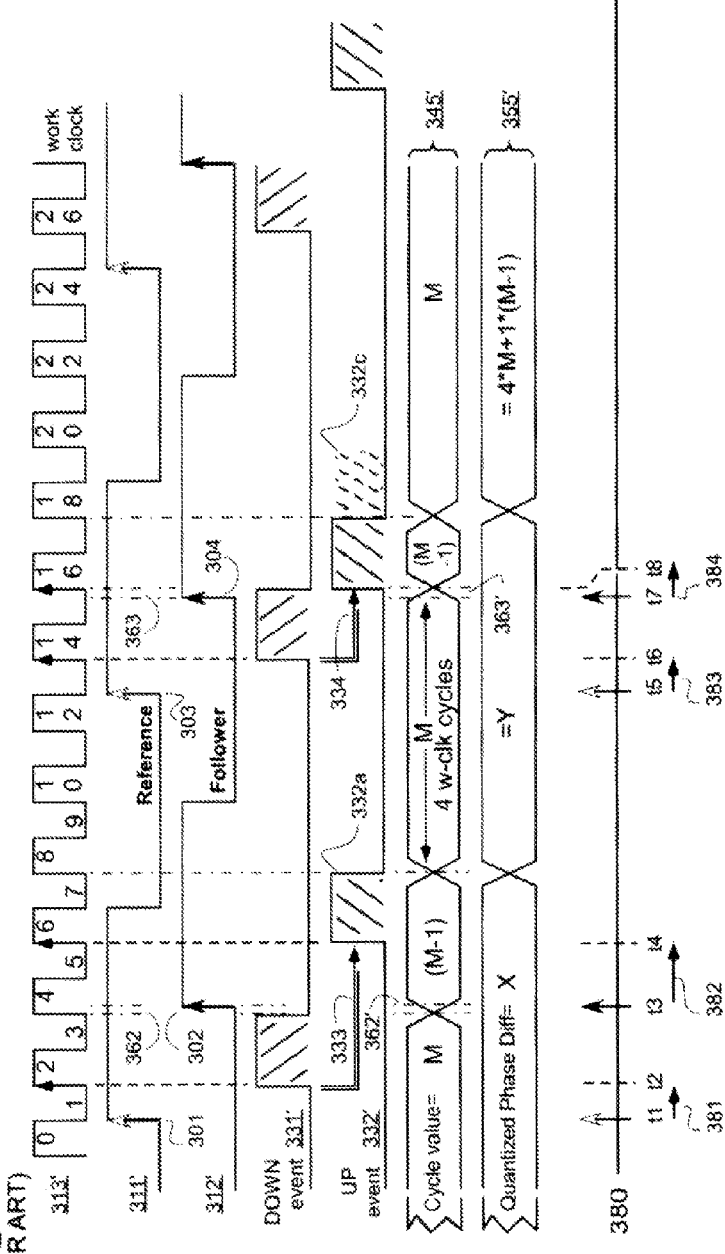
FIG. 3B is a timing diagram showing operations of the synchronous detector of FIG. 3A.

FIG. 3A is a schematic diagram of a conventional, synchronous phase difference detector 300 and FIG. 3B is a corresponding timing diagram showing its operations. Where practical, reference numbers in the 300 century series are used in FIG. 3A for corresponding (not necessarily same) elements with corresponding reference numbers in the 200 century series in FIG. 2A. Signals shown in FIG. 3A are shown in the timing diagram of FIG. 3B are shown with the same number primed. For example, signals reference 311, feedback 312 and working clk 313 are respectively shown in FIG. 3B as signals 311', 312' and 313'. Units 321, 322, 340 and 350 are digital and operate in synchronism with the system working clock 313. The first edge detector 321 detects a switch from low to high by the reference signal 311 and flags this as a DOWN event on line 331 in synchronism with a next rising edge of the working clock 313. This is seen in FIG. 3B by the first DOWN event pulse occurring on line 331' in synchronism with the up edge of half-cycle number 02 of the working clock shown on timing line 313'. Event timing, e.g., events at times t1-t8, and differences 381-384 between timing events t1-t8 are shown on timing line 380. Delay between the actual time (t1) of the reference rising edge 301 and the time (t2) that the DOWN signal 331 goes high represents a first quantization error that the synchronous approach is prone to.

Similarly, the second edge detector 322 detects a switch from low to high by the follower (feedback) signal 312 and flags this as an UP event on line 332 in synchronism with a next rising edge of the working clock 313. This is seen in FIG. 3B by the first UP event pulse 332a occurring on line 332' in synchronism with the up edge of half-cycle number 06 of the working clock shown on timing line 313'. Delay between the actual time (t3) of the follower rising edge 302 and the time (t4) that the UP signal 332 goes high represents a second quantization error that the synchronous approach is prone to.

The UP and DOWN event pulses (331, 332) feed into slip counter 340 and the latter counter 340 outputs a corresponding cycle value signal 345 in synchronism with a next rising edge of the working clock 313. This is seen in FIG. 3B by the first value change on timing line 345' from a first cycle value, M to new value, M−1 in synchronism with the rising edge of half-cycle number 04 of the working clock. The second value change on line 345' from second cycle value of M−1 to new value, M occurs in response to the UP event 332a and this value change happens in synchronism with the rising edge of half-cycle number 08 of the working clock.

Cycle value signal 345 feeds into quantization unit 350 for further digital processing. In one embodiment, the quantization unit 350 performs a duration weighted integration of the cycle values 345 and outputs a phase error signal 355 that is normalized relative to the integration period. For example, if the integration period concludes with each new UP pulse, then a 5 cycle run of the working clock in FIG. 3B will start with half-cycle number 08 (line 313') and end with the close of half-cycle number 17. Then, at the rising (leading) edge of half-cycle number 18, the quantization unit 350 will be internally generating a duration weighted sum with four cycles of the working clock at the M value and one more cycle at the M−1 value again; thus giving a normalized output of {4*(M)+ 1*(M−1)}/5 or (5M−1)/5. Signal phase_error 355 is shown in FIG. 3B as signal 355'.

It may be seen from FIG. 3B that the synchronous phase difference detector 300 is susceptible to quantization error and also to possible jitter effects. By way of example, leading edge 301 of the Reference signal comes at the end of half-cycle number 00 (at time t1) and it is another half-cycle of the working clock before the next rising edge occurs at the start of half-cycle number 02 (at time t2) and allows for sampled detection of the event as a DOWN event (first pulse on line 331'). The difference 381 between time points t1 and t2 represents a first precision loss for detection of the timing of first reference edge 301.

By way of further example, leading edge 302 of the Follower signal comes slightly after the rising edge of half-cycle number 04 (at time t3) and it is almost a full cycle of the working clock later before the next rising clock edge occurs at the start of half-cycle number 06 (at time t4) thus allowing for sampled detection of the event as an UP event (first pulse on line 332'). The difference 382 between time points t3 and t4 represents a precision loss for detection of the timing of the first follower edge 302. The digitally recognized duration 333 between the DOWN and UP events is approximately equal to the actual phase error between edges 301 and 302, minus the skipped-over duration 381 (lost Ref duration) and plus the almost full-cycle extension of duration 382 (gained Follower duration). The latter, almost full-cycle extension 382 is due to the small timing gap shown between 362 and 362' by which the Follower edge 302 missed being detected by the rising edge of clock half-cycle number 04 and hence had to wait till the clock 06 edge of work clock 313' to be detected.

In the case of leading edges 303 and 304 respectively of the Reference and Follower signals, the situation is slightly different because this time the Follower edge 304 comes a short time gap (shown between 363 and 363') before working clock number 16 (that is the half-cycle number) and it is therefore detected by detector 322 as an UP event with the start of half-cycle number 16 rather than with half-cycle number 18. This produces the observed jitter. Had the Follower edge 304 come slightly later, its detection would have been missed by the start of half-cycle number 16. Duration 334 between the second DOWN and UP event pulses is therefore shorter than duration 333 between the first set of DOWN and UP event pulses. Location 332c shows where the second UP event pulse would be if durations 333 and 334 were the same. These are just examples for highlighting short comings of the synchronous approach. In general, the precision and accuracy of the synchronous approach is limited by the sampling period of its one working clock 313.

Referring to FIG. 4A, a first possible solution to the difficulties encountered with fine and coarse phase detectors when each is used alone is to provide both kinds. Where practical, reference numbers in the 400 century series are used in FIG. 4A for corresponding (not necessarily same) elements with corresponding reference numbers in the 100 century series in FIG. 1. Thus repeated description of all elements is not necessary. System 400 includes a variable pulse generator 430 whose frequency and/or phase and/or pulse widths are variable as is indicated by control element 435 and its operative connection to the control/indication line 425 (freq$_2$ and/or $\Phi_2$) of the follower control block 420. The output 438 of variable pulse generator 430 constitutes the follower signal 412. Fine detector 410b provides a fine difference signal 415b in accordance, for example, with the approach shown in FIG. 2A. Coarse detector 410a provides a coarse difference signal 415a in accordance, for example, with the approach shown in FIG. 3A. The follower control unit 420 combines the fine and course error signals (415b, 415a) to provide a responsive control signal 425 for application to pulse generator 430. A problem with the first possible solution 400 of FIG. 4A is how to synchronize the operations of the fine and coarse phase difference detectors (410b, 410a). Detectors 410a and 410b need not work together or at the same time. One approach is to determine whether the aggregate phase difference appears to be relatively large or relatively small and to then responsively activate one but not the other of the coarse and fine phase difference detectors (410a, 410b). In such a case, when the coarse difference detector 410a is alone active, the system 400 is subject to the quantization error of the coarse detector 410a. When the fine difference detector 410b is alone active, the system 400 is subject to the inability of the fine detector 410b to keep up with large, rapid changes of phase between the reference and follower signals.

Without being bound to any position regarding U.S. Pat. No. 6,525,578 (issued Feb. 25, 2003 to Ooishi), it is noted that FIG. 4 of Ooishi '578 shows two detectors coupled to both of an external clock (reference) and internal clock (follower). One of the detectors is termed a "frequency detector 168" and the other a "phase detector 160". A current calculation unit 174 coordinates use of accumulated or filtered results from the frequency and phase detectors 168 and 160 to drive a Current-Controlled Oscillator (CCO 176) of the Ooishi '578 system.

Referring to FIG. 4B of the present application, a second possible solution to the difficulties encountered is shown. Where practical, reference numbers in the 400 prime century series (e.g., 405') are used in FIG. 4B for corresponding (not necessarily same) elements with corresponding reference numbers in the non-primed 400 century series in FIG. 4A. For example, FIG. 4A shows reference signal 411 as an input signal 405 illustrated by signal 408 having frequency and phase 407 and pull-in range 409 controlled by external control signal ext. cntl. 406 while FIG. 4B shows reference signal 411' as an input signal 405' illustrated by signal 408' having frequency and phase 407' and pull-in range 409' controlled by external control signal ext. cntl. 406'. Likewise, follower signal 412 illustrated by signal 438 in FIG. 4A is shown as follower signal 412' illustrated as signal 438' in FIG. 4B. System 400' includes a variable pulse generator 430' whose frequency and/or phase and/or pulse widths are variable as is indicated by control element 435' and its operative connection to the control/indication line 425' (freq$_2$ and/or $\Phi_2$) of the follower control block 420'. The output 438' of variable pulse generator 430' constitutes the follower signal 412'. A major difference between FIGS. 4A and 4B is that the fine difference detector 410b' generates the Up event (432) and Down event (431) count signals for application to the Coarse difference counter 410a' (similar to slip counter 340 of FIG. 3A) rather than allowing the Coarse difference detector 410a' to determine independently from the reference (411') and follower (412') signals when the Up and Down events occur. Thus operations of the fine and coarse phase difference detectors (410b', 410a') are synchronized and the outputs of the fine and coarse detectors may be combined in a coordinated manner to provide an aggregate phase difference indication with greater resolution than the indications provided by the fine and coarse phase difference detectors when considered individually. In one embodiment, both types of detectors (fine and coarse) are simultaneously operational. The follower control unit 420' integrates the synchronized fine and coarse error signals (415b', 415a') from the fine and coarse phase difference detectors to provide a responsive control signal 425' for application to variable pulse generator 430'.

Figure 12:
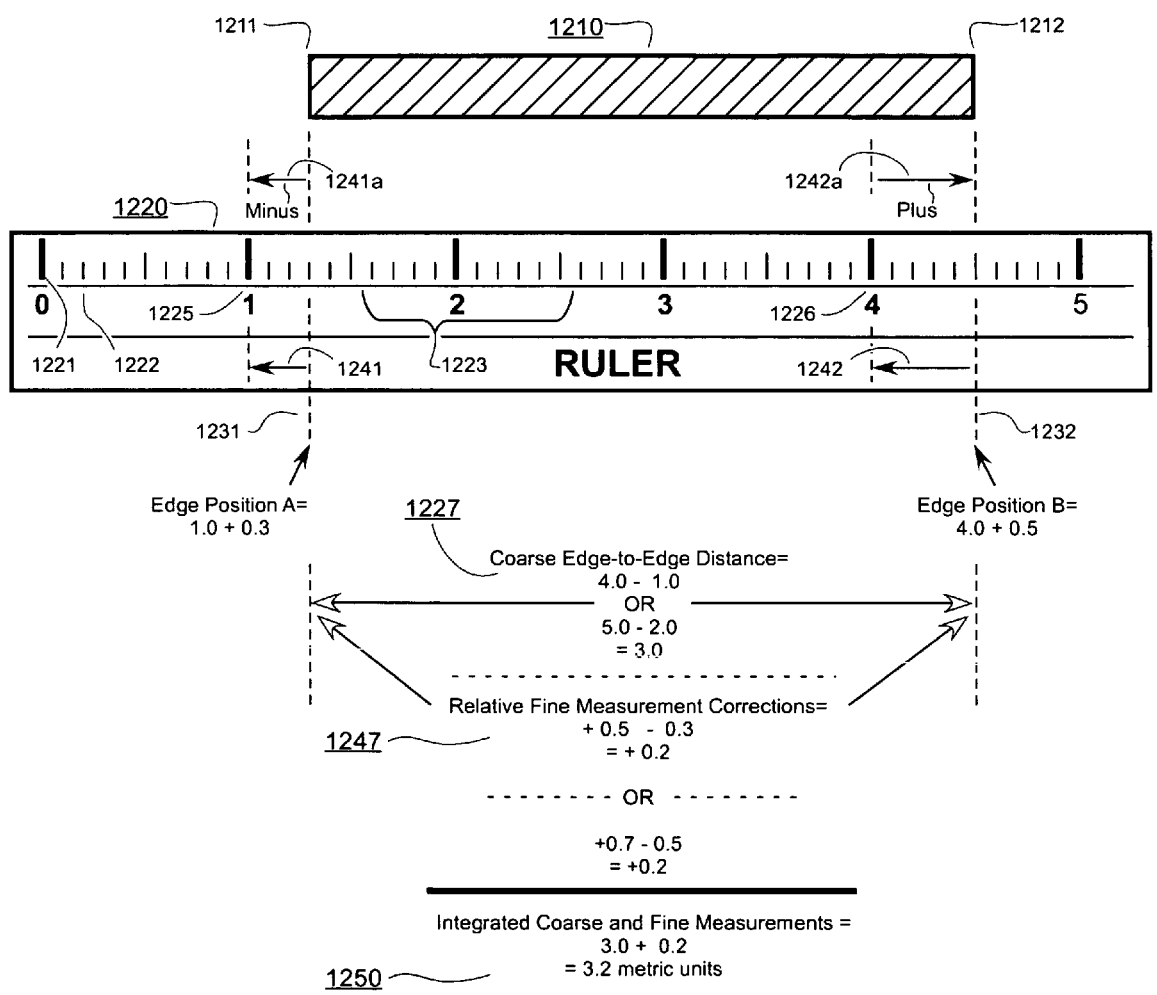
FIG. 12 is a schematic showing how fine and coarse markers of a physical distance ruler may be used in different ways to make an edge to edge measurement.

Referring to FIG. 12, a brief detour is now made to the realm 1200 of physical measurement rulers. A metric ruler is schematically illustrated at 1220. The goal is to measure the longitudinal length of object 1210. A plurality of different methods may be employed for obtaining the final measurement. Object 1210 has respective left and right edges, 1211 and 1212 at its longitudinal ends. The ruler 1220 has a plurality of coarse position markers such as the thickened major line 1221 shown above the ruler's "0" location and clusters of fine position markers such as the fine position marker defined by the narrower minor line at 1222 and representing the ruler's "0.2" location. Marker set 1223 includes a cluster of fine markers (1.6-2.5) and their associated coarse marker (2.0). It may be observed for this embodiment that equally spaced clusters of equally-spaced fine markers have been generated in respective association with a plurality of equally-spaced coarse markers. For example, the marker set 1223 containing coarse marker 2.0 and the cluster of equally-spaced fine markers (1.6-2.5) has a total of J=10 markers where the fifth marker (the K'th marker) among the J markers has been designated as the coarse marker. Although the example is a base 10, metric one, it is possible to have other organizations of marker sets, for example where J is 8, 16, 32, etc. and where a same K'th one of each set of J fine markers is designated as a coarse marker for that marker set (i.e., K=, 1, 2, . . . , J). Another method for creating a ruler is that of generating (drawing) the coarse markers first and thereafter generating respective clusters of fine markers having respectively consistent alignments (synchronizations) to their respective coarse markers such that measurements can be obtained of fine offsets relative to the respective coarse markers by use of the fine markers. Each cluster of J fine-spaced markers can follow its respective coarse marker, or can precede it, or can surround the coarse marker as is the case with the illustrated cluster of marker set 1223.

A conventional measurement technique would proceed as follows. A first full-precision, position reading is taken from a first ruler position 1231 that closely aligns with the left object edge 1211 (in this example the reading is 1.30 metric units, where the units could be in centimeters for example). A respective second full-precision, position reading is thereafter taken from a second ruler position 1232 that closely aligns with the right object edge 1212 (in this example the reading is 4.50 metric units). Next, in accordance with the conventional technique, one subtracts the first full-precision position reading from the second one to thereby obtain a measured length result of 4.50-1.30 which equals 3.20 metric units.

Other techniques could be used for generating a measurement result. For purposes of understanding a below described embodiment of the invention, a first alternate approach is now detailed as follows. A count is made of how many coarse position markers separate the object's edges 1211-1212. (There are at least two sub-variations regarding how to do this. In one sub-variation, the respective coarse markers that immediately precede the object's edges 1211-1212 are identified and a difference is found between their respective coarse position values (i.e., 4.0-1.0=3.0). In another sub-variation, the respective coarse markers that immediately follow the object's edges 1211-1212 are identified and a difference is found between their respective coarse position values (i.e., 5.0-2.0=3.0).) In the exemplary case, the number of coarse markers separating edges 1211-1212 of the object 1210 is found to be three coarse markers (the 2.0 marker as well as the 3.0 and 4.0 ones).

Assuming that the first sub-variation is used (4.0-1.0=3.0), next, it is observed that the object's left edge 1211 is shy of the "1.0" coarse marker (1225) by a fine correction distance 1241 equal to 0.3 as measured along the ruler's fine position markers. It is further observed that the object's right edge 1212 extends beyond the "4.0" coarse marker (1226) by a fine correction distance 1242 equal to 0.5 as measured along the ruler's fine position markers. Therefore, by attaching the appropriate polarities (negative and positive as is indicated at 1241a and 1242a) to the observed fine correction distances, 1241 and 1242, one obtains a total fine correction value of +0.5-0.3=0.2. Adding the relative fine corrections to the coarse measurement, one obtains a correct integrated answer of 3.0+0.2 which equals 3.2 metric units. (Note that if the 5.0 and 2.0 coarse markers had been used instead, the correction values would have been +0.7-0.5 as shown in the lower half of region 1247 and the net correction value would again be +0.2.) In performing this alternate technique, it is possible to use parallel processing. Three people can be called upon to concurrently (or at least in parallel) perform the respective three tasks of: (1) determining the fine offset 1241 between edge 1211 and coarse marker 1225; (2) determining the fine offset 1242 between edge 1212 and coarse marker 1226; and (3) counting the number of coarse markers observed between object edges 1211 and 1212. A fourth person may then receive the measurement results of the first three people and may perform arithmetic processing on the received measurement results while the three people go on to make another set of concurrent measurements. Persons skilled in the art of pipelined electronic circuits may appreciate from this how the alternate method lends itself to providing faster throughput than a method where full precision readings are taken serially, one after the other. (However, when it comes to measuring in the temporal domain rather than the spatial domain, the taking of the two fine measurement readings and of the coarse count will generally not occur all at exactly the same time because one of the measured edges generally occurs later in time than the other and thus the second fine position reading will also generally take place later in time.)

Various permutations to the described alternate measurement technique will become apparent to those skilled in the art after reading this disclosure. For example, rather than using the two coarse markers (1.0, 4.0) that immediately precede the object's left and right edges (1211-1212), or using the two coarse markers (2.0, 5.0) that immediately follow the object's left and right edges, one could use the coarse marker (1.0) that immediately precedes the object's left edge 1211 in combination with the coarse marker (5.0) that immediately follows the object's right edge 1212 and one can measure the fine offset corrections relative to those alternative coarse markers. Or one could vise versa use the coarse marker (2.0) that immediately follows the left edge in combination with the coarse marker (4.0) that immediately precedes the object's right edge, and make fine corrections of appropriate polarity as warranted by the specific technique used.

Of importance, it is to be observed that the steps of obtaining readings from the coarse markers and from the fine markers can be performed in parallel, thus allowing for specialization in each task by a respective and separate reading mechanism and thus speeding up the process when many readings are taken one after the next (assuming now that object 1210 is allowed to constantly change in length). The steps of computing the total fine correction and adding it to the coarse displacement measurement can be performed in pipelined parallel fashion, thus further speeding up the process when multiple measurement readings are to be generated. In general, FIG. 12 may be used to illustrate a displacement measurement method comprised of a first step 1227 of identifying first and second coarse markers corresponding to first and second terminal edges (1211, 1212) of a displacement that is to be measured (this for the purpose of counting or otherwise determining a number of intermediate coarse markers, if any, associated with object edges 1211-1212) and of generating a coarse difference value from the identified and/or counted coarse markers. The displacement measurement method further comprises a step 1247 of identifying first and second fine markers corresponding to the first and second terminal edges (1211, 1212), as well as the steps of determining offsets associated with the identified first and second fine markers relative to adjacent coarse markers, and of allocating polarities (1241a, 1242a) to the determined offsets and of adding the signed offset values. The measurement obtaining and computation steps (1247) for the fine values can be performed in parallel with the coarse displacement counting step (1247), thus speeding up the process relative to the time it might take if all steps had to be performed by a same section of hardware and/or software. Finally the coarse count value can be combined (in step 1250) with the fine corrections sum so as to thereby produce an integrated measurement signal (i.e., 3.2 units) having improved accuracy and a greater precision than the individual precisions of the coarse or fine readings taken alone.

Reference to the above-described, alternate measurement techniques will be helpful in understanding the below detailed circuitry. In one embodiment, a chronological ruler is created by generating a plurality of differently-phased clock signals denoted as phases<0> through <7>. Although the generated plurality has J members where J is based on a power of 2, namely J=8 rather than the J=10 value used in FIG. 12, it will be helpful to think of the rising phase<0> edges as the coarse markers on the ruler 1220 and the interposed phase<1> through phase<7> rising edges as the associated cluster 1223 of fine markers. Intervals between the edges of the differently phased clock signals are measured in the time domain rather than spatially. Of course, without an oscilloscope or other such instrument, the edges of the phased clocks cannot be seen with the human eye. Thus the description of the alternate ruler techniques of FIG. 12 provides a useful analogy. The physical, spatial ruler 1220 does not per se constitute the inventive subject matter however. Also, it will be noted that a more accurate analogy will be one of measuring distances between leading edges of two independently movable objects (i.e., reference and follower signals) where each of the objects can move by a random distance (in the horizontal direction) relative to the ruler 1220 and the fine position of the second-arriving edge is generally not ascertainable until after the fine position of the first-arriving edge is ascertainable. It was easier to start with a single object 1210 of fixed length (i.e., 3.2 units) for purpose of introducing some of the concepts. The case of the two independently moving objects may be extrapolated from the simpler, single object analogy.

Figure 5:
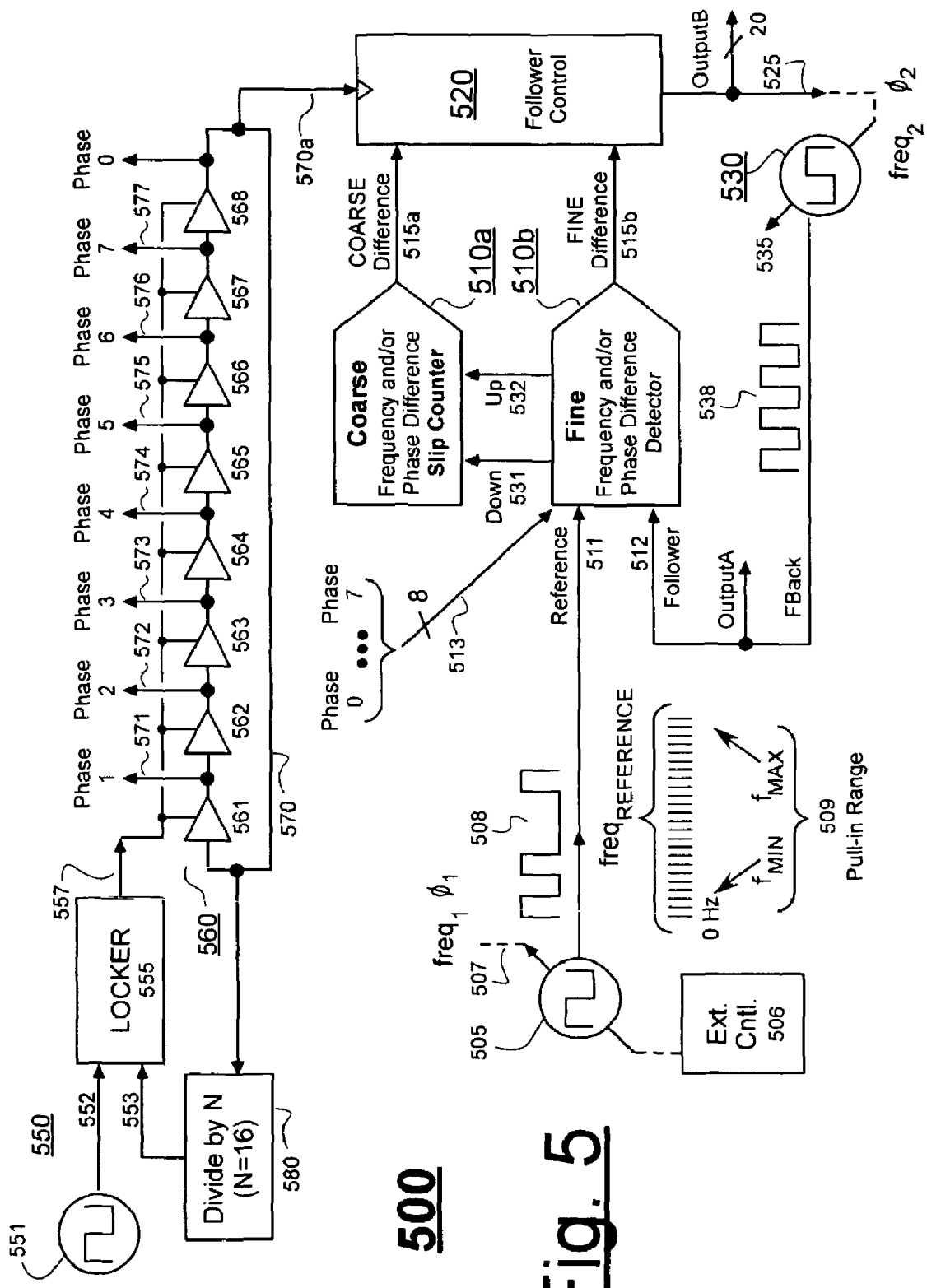
FIG. 5 is a schematic diagram of an embodiment in accordance with FIG. 4B (second control loop) where the fine detector uses a DLL (delay locked loop) for detecting fine timing differences between edges of the reference and the follower clock signals.

Referring now to FIG. 5, a specific embodiment of the second possible solution (FIG. 4B) is shown in greater detail. Where practical, reference numbers in the 500 century series are used in FIG. 5 for corresponding (not necessarily same) elements with corresponding reference numbers in the 400 prime century series of FIG. 4B. For example, to avoid repeating previous discussion, it will be observed that prime reference numbers 405' to 438' in FIG. 4B respectively correlate to non-prime reference numbers 505 to 538 in FIG. 5.

Those skilled in the art will understand that sampling resolution can be improved simply by increasing the frequency of the sampling clock (i.e., the working clock 313 of FIG. 3A for example). However this approach has its drawbacks and limitations. Power consumption by CMOS or like circuits tends to increase as clock frequency increases. Circuit costs and complications tend to increase as clock frequency increases. Thus there is a limit to how much can be gained simply by increasing the frequency of the sampling clock. In the coarse/fine integrated circuit 500 of FIG. 5 (embodied in a monolithic IC), enhanced resolution is realized by use of finely delayed and frequency-multiplied phases of a main working clock 551. A relatively low frequency clock of high precision and relative immunity to environmental effects on its frequency (i.e., temperature variations) may be used to produce a chronological ruler having fine markers spaced apart by substantially smaller delays than the period of the relatively low frequency clock. In one embodiment, the main working clock 551 is crystal regulated and operates at about 12.8 MHz and yet fine markers with spacings of 0.61 ns between them are generated. Each of the finely delayed phase signals (Phase-0 through Phase-7) operates at 16 times the crystal frequency, or at about 204.8 MHz. In one embodiment generation of the phase<0> through phase<7> clock signals is accomplished with a Delay Locked Loop (DLL) 550. DLL 550 comprises an analog phase locker 555 having a first input terminal 552 coupled to the main working clock 551 (i.e., a frequency regulated clock such as one that is regulated by an oscillator crystal—not shown) and a second input terminal 553 coupled to a divide-by-N counter 580, where in one embodiment N=16. The divide-by-N counter 580 receives the Phase-0 signal 570 from a positive feedback oscillator loop 560 comprised of eight sets of essentially identical double inverters: 561-568. Follower control 520 also receives phase-0 signal 570 via input 570*a*. The delay of each double inverter (e.g., 561) is controlled by an analog voltage 557 output to the identical delay stages from the phase locker 555. The phase locker 555 operates to bring the phase and frequency of the divided-by-N clock (553) into equality with those of the working clock 551. Once lock is obtained, the short interval between each rising edge, such that of the Phase-1 signal (571) and the next rising edge of the next signal (i.e. the phase-2 signal 572) is 1/(204.8 MHz*8)1/(1.6384 GHz) or about 0.61 nanoseconds. Other values may of course be used. This is just an example.

Referring to the timing diagram of FIG. 7A, the eight phase clocks 570-577 and their relation to one another are shown as respective waveforms 570'-577'. The time interval between a first rising edge 701 of the phase <0> waveform 570' and the next rising edge 702 is denoted at 705 as the coarse sample interval and it is shown as being equal to the reciprocal of the clock 551 frequency ($f_{CLK551}$) multiplied by N (the divide value used in divider 580 of FIG. 5). The same rise-to-rise period exists for the phase<1> clock signal 571 between each of its successive rising edges 711 (only one shown). However, the rising edge 711 of the phase<1> clock signal 571' is delayed relative to the rising edge 701 of the phase<0> waveform 570' by the fine sample interval 708. This fine sample interval is shown at 708 as spanning between the time point of a first phase<0> edge (also referred to as the e0 time point) and that of a next phase<1> edge (also referred to as the e1 time point). The (e0) to (e1) time interval is equal to the reciprocal of: the clock 551 frequency ($f_{CLK551}$) multiplied by N and further multiplied by the number, M of identical delay stages (561-568) in the phase locked loop, where in this example the number, M of stages is 8.

FIG. 7A further shows the respective rising edge timings, e2 through e7 of the rising edges for the remaining waveforms 572' (phase<2>) through 577' (phase<7>), It also shows the next phase<0> edge 702 at time point e8 (also referenced as e0'). It is within the contemplation of the disclosure to use other numbers of delay stages besides M=8 and to use other divider values besides N=16 and to vary the frequency of the main working clock 551 as may be appropriate for given applications. In accordance with the invention, the fine sample interval (fsi=1/($f_{551}$*N*M)) is used to determine where chronologically speaking, is the most likely location of the rising edge of the reference signal and the location of the rising edge of the follower signal relative to the phase<0> through phase<7> rising edges 701-771. These phase<0> through phase<7> signals therefore serve as a chronological ruler against which measurements may be taken for determining edge to edge difference between a reference signal and a follower signal. The fine portion of the total phase difference between the reference and follower rising edges may be determined from these fine position readings taken along the chronological ruler. In one embodiment, the fine phase position of a given rising edge (of the reference or follower signal) is expressed as a signed offset value (e.g., −7 to +7) relative to each phase<0> edge (e.g., e0, e0', e0'', etc.). In one embodiment, the occurrence of a coarse down event 531 is signaled when the rising edge of the reference signal is detected during course sampling interval 705 as delimited by consecutive rising edges of the phase<0> clock. Also in the one embodiment, the occurrence of a coarse up event 532 is signaled when the rising edge of a follower signal is detected within the same coarse sampling interval 705 (e0 to e0').

Figure 6:
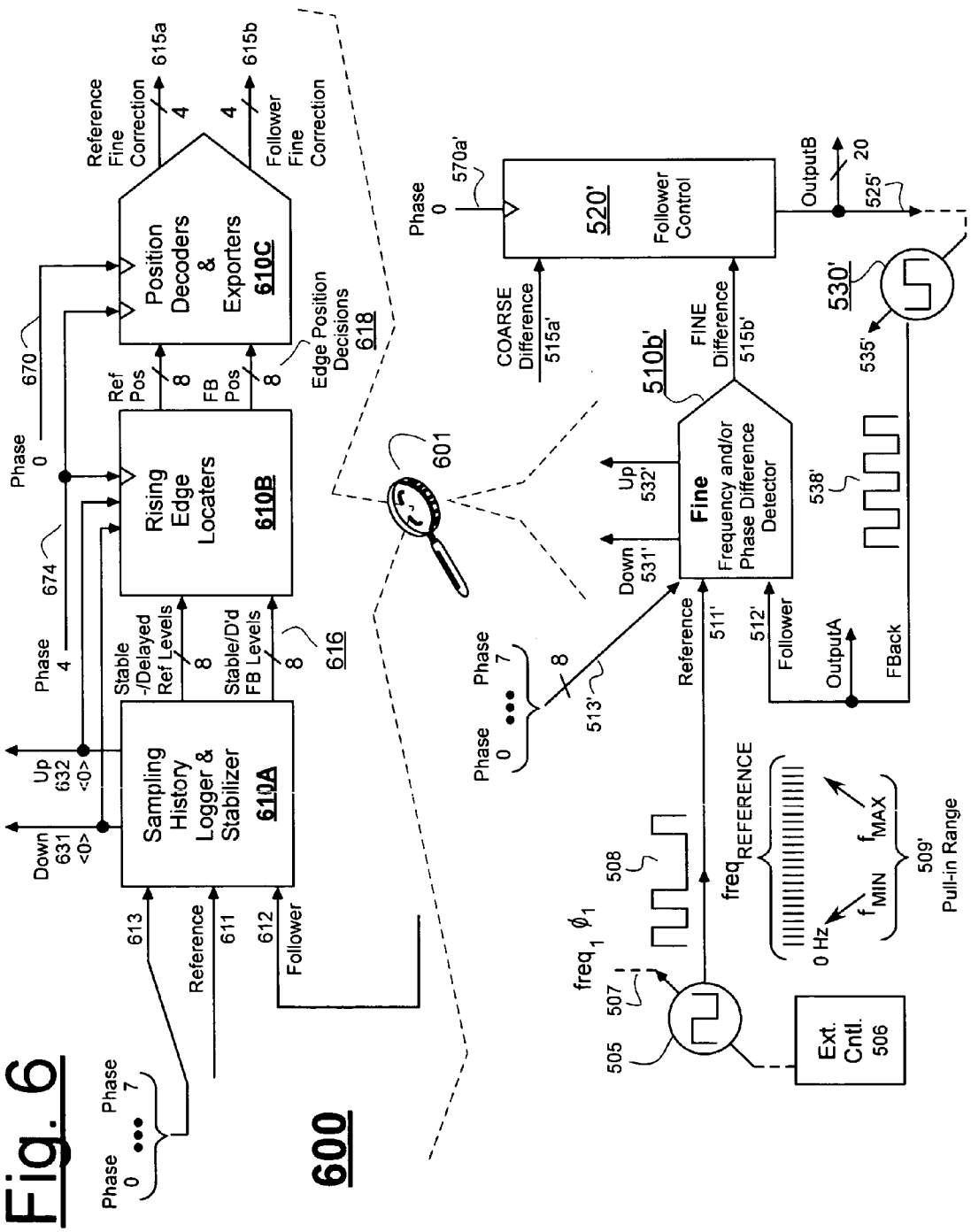
FIG. 6 is block diagram of one embodiment of the fine detector of FIG. 5.

Referring to FIG. 6, magnifier symbol 601 indicates that circuitry at 600 represents a detailed view of one particular embodiment of the fine phase difference detector 501*b*'. Where practical, prime reference numbers in the 500 century series are used in FIG. 6 for corresponding (not necessarily same) elements with corresponding reference numbers in the non-prime 500 century series of FIG. 5 and prime 400 century series of FIG. 4B. For example, to avoid repeating previous discussion, it will be observed that prime reference numbers 405' to 438' in FIG. 4B and non-prime reference numbers 505 to 538 in FIG. 5 respectively correlate to prime reference numbers 505' to 538' in FIG. 6. Embodiment 600 comprises three major sections. First is a front-end signal sampling section 610A that includes a logger of the sampling history and also a delay-based stabilizing mechanism for stabilizing signal levels so that possible meta-stable effects in front-end flip flops do not infect the digital signals utilized for subsequent decision making. The front-end signal sampler 610A receives the reference signal 611, the follower signal 612 and the eight finely staggered phase signals (<0>-<7>) on bus 613. A set of sixteen, delayed and stabilized level signals 616 are output from the sampler 610A to a corresponding set of sixteen rising edge locators in unit 610B. Eight of the rising edge locators are used to determine the fine phase location (if any) of a rising edge of the reference signal while the other eight are used for making fine position decisions regarding the likely chronological position of the follower rising edge (if present). Location decisions within unit 610B are made in synchronism with the phase <4> clock signal (674) so that such decision-making operation is time staggered relative to the phase <0> switching times of output signals 616 of the front-end signal sampler 610A. Signals 618 represent edge position decisions made by unit 610B. These position decisions 618 are next submitted to a set of position decoders and result exporters provided in unit 610C. The front-end of the position decoding and exporting unit 610C is clocked by the phase <4> clock signal (674) just as is unit 610B while the signal exporting output portion of unit 610C is clocked by the phase <0> signal 670. Fine correction values (615*a*) for the reference rising edges are therefore exported in phase with the phase <0> clock (570*a*') driving the follower control unit 520'. Similarly, fine correction values (615*b*) for the follower rising edges are exported in phase with the phase <0> clock (570*a*'). The follower control unit 520' can use the fine correction values (615*a*, 615*b*) for the reference and follower rising edges in coordinated synchronism with the coarse difference signal 515*b*' to improve the aggregate resolution of the control/indication line 525' ($freq_2$ and/or $\Phi_2$) driving the variable pulse generator 530'.

Referring to FIG. 7B, in one embodiment the coarse slip counter 510*a* of FIG. 5 is constituted by a saturating counter of predefined range. The saturating counter 510*a* stops increasing or decrementing its count (does not wrap around) in response to respective Up (532) and Down (531) pulses when it hits the ends of its predefined count range (e.g., zero to $2^P$, where P is an integer chosen according to application requirements, i.e., P=8 or 16 or 17 or 20 or some other integer). If the saturating counter 510*a* receives both an Up and Down pulse for a same rising edge of the phase<0> clock, it ignores them both. In FIG. 7B, the coarse count is assumed to be zero at the time of coarse clock edge c00 (same as rising edge 701' of the phase<0> clock). At the time of c01 (same as rising edge 702' of the phase<0> clock), a rising edge of the follower (feedback) signal 712' is detected. At time point c02 (same as rising edge 703' of the phase<0> clock, the UP Event signal 732' goes high in response. At c03, the coarse count increments to 1 in response as shown on line 745'. At the time of coarse clock tick c05, a rising edge of the reference signal 711' is detected. At c06, the DOWN Event signal 731' goes high in response. At c07, the coarse count decrements back to 0 in response as shown on line 745'. Further exemplary operations of the coarse slip counter 510a are shown over remaining coarse clock ticks c08 through c35. Note that at coarse clock tick c32 the counter 510a simultaneously receives UP and DOWN input commands and its response is to not change its count. Thus the count remains at 0 for clock ticks c33-c35.

Referring to FIG. 8A, shown is one embodiment 800 of the reference signal sampling and logging unit 610A of FIG. 6. A relatively non-delayed version of the reference signal is denoted as Ref(0) where the parenthetical, (0) indicates a relative delay amount of zero ticks of a corresponding flip flop clock. The Ref(0) signal is shown being supplied to the D input terminal 805 of D-type flip flop 810. Ref(0) is further supplied to the D inputs of flip flops 811, . . . , 816, 817. The clock input terminal of flip flop 810 is toggled by the phase zero clock signal (ph<0>). As a result, the Q output signal from flip flop 810 represents the current reference signal Ref(0) as sampled by the phase<0> clock and delayed by one tick of the phase<0> clock. This signal is shown at 830 and denoted as $Ref_{p0}(-1)$ where the subscripted "p0" identifies the respective sampling clock. The once sampled and delayed reference signal 830 is next applied to the D input terminals of two further flip flops, 820 and 802 both of which are clocked by the phase<0> clock signal. The twice-delayed reference signal at the Q output 840 of flip flop 820 is denoted as $Ref_{p0}(-2)$. It is also referred to here as the Settled Ref <0> sample point signal 840. Flip flops, 820 and 802 are essentially identical and are loaded by the same input load of node 830 and driven by the very same signal, $Ref_{p0}(-1)$. Thus it is fair to expect that their Q output states will be essentially the same and precisely synchronized to one another. Two separate flip flops are used (820 and 802) rather than one so that the loading on the Q output (840) of flip flop 820 can be guaranteed to be essentially the same as the loading on the Q outputs (841-847) of the other sample-taking flip flops 821-827, thus assuring essentially identical propagation delays along each sampling pathway and assuring preservation of the chronological ordering of the sample data as that data propagates along the sampling pathways for further processing in circuit 900 of FIG. 9A (described below).

FIG. 8A includes a time-versus-magnitude graph at 801. Referring briefly to that plot 801, slanted line 808 represents a possible rising edge of the Ref(0) signal with an exaggeration of the edge's slope. Rising edge 808 can occur at any time but for purpose of example it is assumed to be crossing the switching threshold level ("Th") of a given sampling flip flop (i.e., DFF 814, not shown) somewhere around the vicinity of the rising edge of phase<4> (at time point e4). (Note that this e4-timed edge 808 falls within, although very near the end of a Coarse Interval Period marked as CIP:5-5 and also as 807. Interval 807 (extending between time points e4.5" and e4.5) relates to implementation details of FIGS. 9A-9B and can be ignored for the moment.)

It is assumed here that rising edge 808 crosses to above threshold ("Th") around the time point e4 of the rising edge of phase<4> (e.g., slightly before or slightly after). It may be appreciated that those of the front end sampling flip flops (DFF's 810-817) that are clocked by fine phase signals with edges e0 through e2 will generally see the Ref(0) signal 808 as being below their respective threshold levels ("Th") while those that are clocked by fine phase signals with edges e6-e7 and beyond (e.g., e0', e1', etc.) will generally see the Ref(0) signal as being above their respective threshold levels. For those FF's clocked by e3, e4 and e5, it may be a close call as to whether the current Ref(0) magnitude at respective time points e3, e4, e5 is sufficient large to definitively cause a Q output of the corresponding flip flop to head to logic low ("0") or to logic high ("1"). {Incidentally, since all of flip flops 810-817 are simultaneously fabricated on a same monolithic IC with essentially identical design specifications, they should exhibit essentially the same switching threshold level ("Th") and other related characteristics irrespective of changes in temperature, power supply voltage or process attributes.} Given that noise or other random factors in the vicinity of edges e3 through e5 might tilt the switching outcome meta-stably one way or the other, there is a likelihood that some of respective flip flops 813-815 (not shown) will undergo a meta-stable transition that sends each either to a decision point of being above threshold or below threshold. The probabilistic switching of a given flip flop to above or below its threshold level is represented by symbol 809. By way of example, flip flop 814 may transition to a logic "0" output level at its Q output even though flip flops 813 and 815 transition to a logic "1" output level at their Q outputs in response to the rising edge 808 of the Ref(0) signal. It may be left to a pattern recognition circuit to decide what chronological position to assign to the rising edge 808 of the Ref(0) signal given an observed pattern of responses by sampling flip flops 810-817 (or by the more settled, FF's 820-827, as will be explained shortly). In one embodiment, the pattern recognizer looks for the first logic high ("1") following one or more consecutive logic lows ("0") and assigns the rising edge 808 to the time point of that first observed, logic high ("1"). For example the first binary 1 in the left-to-right occurring series 0001xxx (also read left to right), where "x" represents a don't care binary value. (This will be seen in the logic tables of FIG. 11, but note that the x01xxxxx patterns there are to be read right-to-left in wrap-around fashion.)

Referring still to FIG. 8A, note that if the sampled signal magnitude of Ref(0) at the D input of a given flip flop (FF) is close to threshold ("Th") at the time of the corresponding rising edge of the flip flop's clock signal (e.g., at time points e3, e4, e5), it may take a longer amount of time for that particular flip flop (e.g., 813-815) to transition towards and settle into its final logic state of being either a definite logic "0" or logic "1" as compared to others of the front-end sampling flip flops (810-817) for whom the decision is clearer because the difference between Ref(0) and Th is larger at the time their clock terminals are strobed. Such an increased time for binary decision-making may be attributed to meta stable effects such as those dependent on the amount of perturbation input energy applied to a bi-stable system (e.g., a flip flop) to drive it towards one or the other of its bi-stable output states. Delay is used in the illustrated sampling and logging circuitry 800 to accommodate for possible meta stable meandering in the front-end sampling flip flops 810, 811, . . . , 817 before they settle into their respective bi-stable output states. The additional delay increases likelihood that the respective output sample values 840, 841, . . . , 847 of corresponding FF's 820-827 in the second layer will be fully stabilized to either a clear logic "0" or a logic "1" level at the time that the latter signals 840-847 are used in edge locator circuit 610B. It is desirable to keep the order of occurrence of transitions for the second-layer output signals 840-847 chronologically the same as the sequence of transition events for the first-layer output signals 830-837. Thus, just as the Q output 830 of the front-end sampling flip flop 810 is sampled by second-layer FF 820 at a time point that is one coarse clock interval later by applying the phase<0> signal to FF 820, the Q output of flip flop 811 is similarly sampled one course interval (CIP) later by applying the phase<1> signal to the clock input terminal of flip flop 821, and so on. Due to the double samplings, the second layer output signals, 840, 841, . . . , 847 are twice delayed by their respective sampling signals ph <0> through ph <7>. This is indicated in FIG. 8A by the parenthetical "(−2)" timing indicator attributed to output signals, 840, 841, . . . , 847. A logic high ("1") level at node 841 for example, indicates that the Ref(0) signal was probably above threshold "Th" at the time of sampling by a respective edge e1 of the phase<1> signal two coarse intervals ago as measured along that phase<1> waveform (see 571' of FIG. 7A). Similarly, a logic low ("0") level at node 840 indicates that the Ref(0) signal was probably below threshold "Th" at the time of sampling by a respective edge e0 of the phase<0> signal two coarse intervals ago as measured along that phase<0> waveform (570' of FIG. 7A).

It is to be noted in the time versus magnitude graph 801 of FIG. 8A that time point e7" occurs just before the e0 edge time and that time point e0' occurs right after the e7 edge time. So e7 is not the furthest apart edge from edges e0 and e0'. Instead e4 is. The relevance of this will become apparent when FF 904 of FIG. 9A is discussed in detail. Briefly for now, in the embodiment of FIGS. 9A-9B, a one-pass sampling run can start between edges e4" and e5" (denoted as time point e4.5") and that one-pass sampling run can end as early as between edges e4 and e5 (denoted as time point e4.5) if a rising edge such as 808 is detected in that one-pass sampling run. The one-pass sampling run can extend longer though if rising edge 808 does not arrive in the first Coarse interval (CIP:5-5) of that sampling run.

In FIG. 8A, AND gate 803 couples to inter-layer node 830 (between sampling layers 810-817 and 820-827) and also to the QB output of flip flop 802 so as to detect the condition where the once delayed, $\text{Ref}_{p0}(-1)$ signal (of node 830) is at a logic high ("1") while the twice-delayed signal $\text{Ref}_{p0}(-2)$ is at logic low ("0"), this indicating a transition by the Ref(0) signal from low to high (from "0" to "1") during the interval between the rising edge of the phase<0> signal as twice delayed (−2) and the rising edge of the phase<0> signal as once delayed (−1). The output signal 803o of AND gate 803 is therefore denoted here as $\Delta\text{Ref}_{p0}(-2, -1)$. Flip flop 804 samples the output 803o of AND gate 803 at the next rising edge of the phase<0> clock and outputs the result on Q output terminal 806 as a $\Delta\text{Ref}_{p0}(-3, -2)$ signal, this notation indicating that the signaled transition from low to high ($\Delta\text{Ref}_{p0}$) occurred between 3 and 2 cycles ago, as measured along the waveform of the phase<0> clock. The signal on Q output terminal 806 is also referred to herein as the Coarse Down Event signal and it corresponds to line 531' of FIG. 6. Note that the $\Delta\text{Ref}_{p0}(-3, -2)$ signal switches between high and low in synchronism with rising edges of the phase<0> clock. Flip flops 802, 804 may be reset by asserting ResetBar to logic low ("0"). The other flip flops 810-827 of FIG. 8A are also reset when ResetBar is asserted to "0".

Figure 8B:
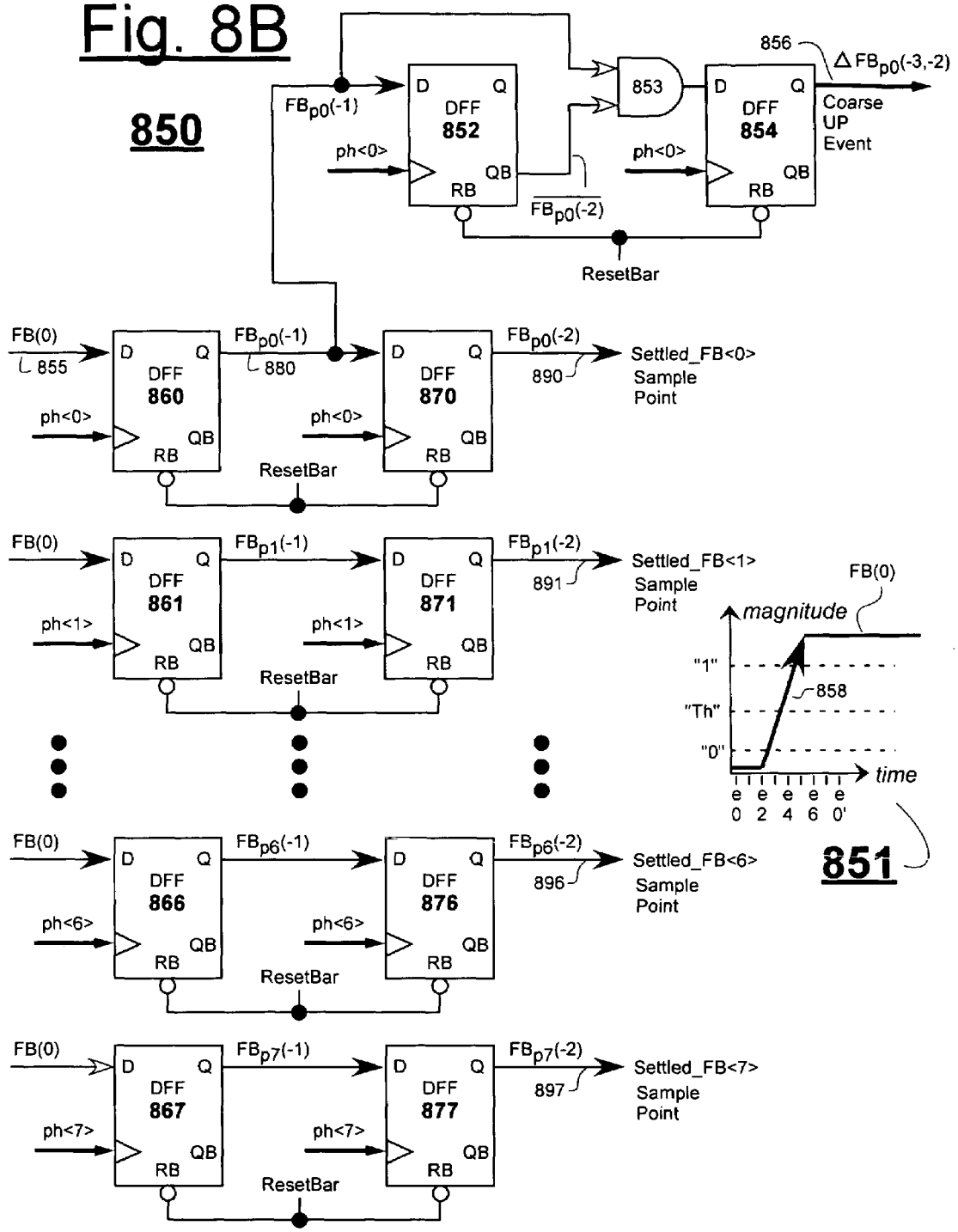

FIG. 8B shows a schematic for a circuit 850 that provides substantially the same function for the follower or feedback signal, FB(0) where that FB(0) signal is applied to the D input terminal 855 of flip flop 860 as well as to D inputs of other flip flops 861-867. Reference numbers in FIG. 8B correspond to those in FIG. 8A with the exception that numbers in FIG. 8B are generally advanced by an amount of 50 relative to those in FIG. 8A and with the further exception that the feedback signal is used instead of the reference signal. Thus, further explanation of FIG. 8B is not necessary given that it may be understood from the foregoing description of FIG. 8A. Note that edge 858 of graph 851 can arrive at a sampling time other than the one detected in the example of graph 801.

Referring to the combination of FIGS. 9A-9B, a first rising edge locater circuit 900 and 900' is shown corresponding to the reference-processing half of rising edge locator circuit 610B of FIG. 6. There are two overlapping and redundant pattern generating mechanisms shown in FIGS. 9A-9B. One relies on correct timing by a so-called, Fine Down Event signal (906) and the other does not. The one that relies on signal 906 is described first.

Every time the Coarse Down event line 806 goes high, a corresponding Fine Down event signal 906 is asserted by flip flop 904 for resetting flip flops 910-980 in FIGS. 9A-9B to their Q="0" states shortly after the next rising edge of the phase<4> clock. This is referred to here as wiping the slate clean or erasing the blackboard. Also, a set of decision-capturing flip flops 916-986 are strobed with the phase<4> clock so as to capture the one-pass detection results provided by flip flops 910-980 just before the slate is wiped clean by assertion of the Fine Down event signal 906. So in general, the decision-making slate is wiped clean (reset) just after time point e4 and the system then waits for a next series of post-stabilization, rising edges ($\text{Ref}_{p0}(-2)$ through $\text{Ref}_{p7}(-2)$) from circuit 800 where that series will come as Ref(0) next transitions from logic low ("0") to logic high ("1") as depicted in exaggerated form in graph 801. The very first rising edge that can theoretically come in is one coincident with time point e5 after FF 904 switches low following the presentation of a logic low ("0") on line 806 and presentation of an e4 rising edge by the phase<4> clock. However, due to the speed with which e5 follows e4 in some embodiments and due to the fact that the slate cleaning reset (906) may still be asserted at that time, the system may miss the very first e5 event and it will be able to see only the very next e6 event if it happens to come that early. This is a fairly rare situation though, namely, dealing with a case where a next rising edge of the reference signal comes in alignment with the e5 or e6 time point that immediately follows the wiping clean of the slate. Focus is kept here on the more general situation. Assume that line 906 already went high and was applied to the RB terminals of flip flops 980, 910, 920, . . . , 970 via their respective NOR gates 982, 912-972 and then line 906 went low between a next set of e4-e5 edges, thus resetting all of FF's 910-980 and then enabling them to switch from their wipe-created logic low ("0") states to logic high ("1") states. A so-called one-pass detection run begins at around time point e4.5" along the horizontal time line of graph 801. Then, when a next transition of one or more of the $\text{Ref}_{p0}(-2)$ through $\text{Ref}_{p7}(-2)$ signals occurs (where the latter signals of nodes 840-847 are also referenced as the Settled Ref<0> through Ref<7> Sample Points), flip flops 980, 910, 920, . . . , 970 will be ready to perform a one-pass detection to indicate which of the $\text{Ref}_{p0}(-2)$ through $\text{Ref}_{p7}(-2)$ signals first transitioned from logic low ("0") to logic high ("1") after the one-pass detection run commenced at around time point e4.5" (shown at 807 of FIG. 8A). The detection run is preferably a one-pass one that terminates in response to the delayed Coarse Down Event signal 806. A snapshot picture is taken at that termination point of the states of asynchronously-driven flip flops 910-980. Thereafter the slate of asynchronously-driven flip flops 910-980 is wiped clean (erased) with a group reset passed via NOR gates 912-982. There are actually two types of one-pass runs as will be seen when timing graphs such as 990 and 991 are compared. The first type of one-pass run (i.e., 990) terminates at the first e4 edge it encounters. The second type of one-pass run (i.e., 991) terminates at the second ph<4> edge (e4') it encounters. To better understand why the second type of one-pass run (the one that overruns its first encounter with e4) is allowed, pretend for the moment that run-terminating NOR gates like 982, 912, 922, etc. are not present—and as a result, all of the asynchronously-driven flip flops 910-980 may be tickled by their respective Settled_Ref signals of respective nodes 840-847 towards eventually flipping high after Ref(0) has flipped to logic high ("1") and after all of edges e0-e7 have thereafter come through one or more times. The flip-blocking NOR gates of the circuit (e.g., gates 981, 911, 921, etc.) are connected such that, even if the one-pass run terminating feature of circuitry 900 fails, the flip-blocking NOR gates (911, 921, . . . , 981) will block further strobings of selected ones of the asynchronous detection flip flops (910-980) after a first one or more others of those flip flops (910-980) have already fired. This will be described in more detail later.

Referring specifically to the circuit section constituted by flip flop 980, NOR gates 981-982, AND gate 983 and decision-point capturing register 986, the operation is as follows. It is taken as a given that $Ref_{p6}(-2)$ was low and that the very first transition to high after a slate cleaning event is by the $Ref_{p7}(-2)$ signal (a.k.a. Settled_Ref<7>). The sequence of events is represented graphically at 997. The low to high transition of the Settled_Ref<7> signal (847') is seen at time point e7. Settled_Ref<0> next transitions to high at e0. This is followed consecutively by the Settled_Ref<1> through Settled_Ref<4> signals transitioning to high at e1, e2, e3 and e4. Shortly after Settled_Ref<4> goes high at e4, the Fine Down Event line 906 goes high and wipes the slate clean (resets all of flip flops 910-980) so that rising edge events immediately after e4 are not seen by the edge detecting flip flops 910-980. However, the decision fetching flip flops 916-986 are strobed just before the slate is wiped clean and thus FF's 916-986 capture a snapshot of the states of edge detecting flip flops 910-980 at that pre-wipe moment. Decision fetching FF's 916-986 output fetched decision point signals 917-987 in phase with the phase<4> clock. An 'x' mark is placed at location 999 after the e7-e4 sequence of graph 997 to indicate that this is the end of this first type of one-pass detection run and that the snapshot is taken then by FF's 916-986.

The Q output (985) of FF 980 connects to NOR gates 912, 922, . . . , 952 and thus forces flip flops 910-950 low before the one-pass detection run ends at time point 999 and before the termination snapshot is taken. The result of this sequence of events is that a specific latent image pattern 989 develops in the decision fetching flip flops 916-986. For the Ref<7> detecting circuitry (980-985), the pattern works out to be: 1000 . . . 0000 as read left to right from the MSB to the LSB of Rising_Ref bits 7 through 0. RR bit 6 is zero because the e6 rising edge did not arrive before the snapshot was taken at termination time point 999. RR bit 7 is one ("1") because the e7 edge (of graph 997) was able to get through AND gate 983 without being blocked by any of the Rising_Ref<0> through Rising_Ref<4> signals that couple to NOR gate 981 from respective nodes 915 to 955 inclusively. RR bits 0 through 4 are each a zero ("0") because the logic high ("1") of Q output line 985 was able to propagate to NOR gates 912-952 and reset respective FF's 910-950 before the snapshot was taken at termination time point 999. The state of RR5 will also be "0". In one embodiment, pattern recognition revolves around the "10" bit pattern encompassed within box RP76 of developed pattern 997 as shall be seen below.

Referring next to the specifics of the circuit section constituted by flip flop 910, NOR gates 911-912, AND gate 913 and decision-point capturing register 916, the operation is as follows. It is taken as a given that $Ref_{p6}(-2)$ was low, that $Ref_{p7}(-2)$ was low, and that the very first transition to high after a slate cleaning event is by the $Ref_{p0}(-2)$ signal (a.k.a. Settled_Ref<0> on line 840'). The sequence of events is represented graphically at 990. The low to high transition of the Settled_Ref<0> signal (840') is seen at time point e0. Settled_Ref<1> next transitions to high at time point e1. This is followed consecutively by the Settled_Ref<2> through Settled_Ref<4> signals transitioning to high at e2, e3 and e4. Shortly after Settled_Ref<4> goes high at e4, the Fine Down Event line 906 goes high and wipes the slate clean (resets all of flip flops 910-980) so that rising edge events immediately after e4 are not seen by the edge detecting flip flops 910-980. However, once again, the decision fetching flip flops 916-986 are strobed just before the slate is wiped clean and thus FF's 916-986 capture a snapshot of the states of edge detecting flip flops 910-980 at that pre-wipe moment. An "x" mark is placed at the end of the e0-e4 sequence of time plot 990 to indicate that this is the end of this first type of one-pass detection run and that the snapshot is taken then by FF's 916-986.

The Q output (915) of FF 910 connects to NOR gate 981 for blocking FF 980 from flipping to a set state ("1") and thereby resetting FF's 910-950. (This connection is not necessary for the type-1 one-pass run 990 because the "x" marked end of the e0-e4 sequence 990 happens before the e7 rising edge has a chance to arrive.) Non-blocked rising edges of the e0-e4 sequence 990 set their respective flip flops 910-940 before the one-pass detection run 990 ends at its "x" and the snapshot is taken. The result of this sequence of events is that a specific latent image pattern 919 develops in the decision fetching flip flops 916-986. For the Ref<0> detecting circuitry (910-915), the pattern works out to be: 000x . . . 1111 as read left to right from the MSB to the LSB of Rising_Ref bits 7 through 0. RR bits 6 and 7 are zero because the e6 and e7 rising edges did not arrive before the snapshot was taken at termination time point "x". RR bits 0 through 3 are each a one ("1") because the e0-e3 edges (of graph 990) were able to get through respective AND gates 913-953 without being blocked by any of the other Rising_Ref signals that couple to respective NOR gates 911-951. The state of RR4 may be either a "0" or a "1" due to possible metastability effects of the RB terminal of flip flop 950 going low very close in time to when the output of AND gate 953 transitions to high. However, it will be seen that the pattern recognition circuitry used in this embodiment is unaffected by the state of RR4 in the case of pattern 919 and thus RR4 is marked as a don't care (x) in pattern 919 (RR<7:0>=000x . . . 1111).

Referring thirdly to the specifics of the circuit section constituted by flip flop 920, NOR gates 921-922, AND gate 923 and decision-point capturing register 926, the operation is as follows. It is taken as a given that Rising_Ref's <6>, <7> and <0> were low and that the very first transition to high after a preceding slate cleaning event is by the Settled_Ref<1> signal on line 841'. The sequence of events is represented graphically at 991. Unlike graph 990, graph 991 shows a type-2 one-pass run wherein two instances of the ph<1> rising edge are seen (at time points e1 and e1') and two instances of the ph<4> rising edge are seen (at time points e4 and e4'). This phenomenon occurs in the given embodiment due to propagation timing effects. The low to high transition of the Settled_Ref<1> signal (841') is seen at time point e1. (Referring to FIG. 8A, this transition on line 841 can happen sufficiently close to the phase<0> edge that AND gate 803 and FF 804 miss it at this moment and such that the Coarse Down Event signal 806 does not responsively flip to high until the next occurrence at time point e0' of the phase<0> rising edge, namely one coarse tick later. As a result, Fine Down Event signal 806 (FIG. 9A) also does not responsively flip to high until the next occurrence at time point e4' of the phase<4> rising edge, namely one coarse tick later. This slippage by one course tick is denoted as 991s in graph 991. (Similar slippages occur in graphs 992, 993 and 994.) Referring still to timing diagram 991, after the Settled_Ref<1> signal (841') flips high at time point e1, the Settled_Ref<2> next transitions to high at e2. This is followed consecutively by the Settled_Ref<3> through Settled_Ref<4> signals transitioning to high at e3 and e4 respectively. Although Settled_Ref<4> goes high at the first occurrence of e4, the Fine Down Event line 906 has not yet gone high to wipe the slate clean (to reset all of flip flops 910-980) due to the slippage effect 991s mentioned above. Therefore, further rising edge events after e4 are seen by the edge detecting flip flops 910-980 and bits RR5 and RR6 also flip high. RR7 is blocked from flipping high because the first high by Rising_Ref<1> causes NOR gate 981 to output a "0" to AND gate 983. Also, the coupling of node 925 to flip-blocking NOR gate 911 prevents flip flop 910 from flipping and its "0" state is thus preserved. At the run termination point of e4' (at the end of slippage time 991s), the decision fetching flip flops 916-986 are strobed just as before and the slate is wiped clean. FF's 916-986 capture a snapshot of the states of edge detecting flip flops 910-980 at that pre-wipe moment. An "x" mark is placed at the end of the e1-e4-e4' sequence of graph 991 to indicate that this is the end of the type-2 one-pass detection run and that the snapshot is taken then by FF's 916-986.

The Q output (925) of FF 920 connects to NOR gates 911 and 981 for blocking FF's 910 and 980 from setting and for 980 thereby resetting FF's 910-950. Non-blocked rising edges of the e1-e4 sequence 991 set their respective flip flops 920-940 to "1" before detection run 991 ends. The result of this sequence of events is that a specific latent image pattern 929 develops in the decision fetching flip flops 916-986. For the Ref<1> detecting circuitry (920-925), the pattern works out to be: 0111 ... 1110 as read left to right from the MSB to the LSB of Rising_Ref bits 7 through 0.

By referring to FIGS. 9A-9B it may be seen that a similar type of explanation applies for the latent pattern 939 (RR<7:0>=0111 ... 1101) generated by the 930-935 circuit section. A similar type of explanation applies for the latent pattern 949 (RR<7:0>=0111 ... 1011) generated by the 940-945 circuit section. And a similar type of explanation applies for the latent pattern 959 (RR<7:0>=0111 ... 0111) generated by the 950-955 circuit section.

Referring next to the specifics of the circuit section constituted by flip flop 960, NOR gates 961-962, AND gate 963 and decision-point capturing register 966, the operation reverts back to a type-1 one-pass run where termination occurs with the first encountered e4 edge. No flip-blocking of register 980 is employed in one-pass detection run 995. Thus after the first arriving Ref<5> signal on line 845' flips FF 960 to logic high ("1"), the subsequent Ref<6> and Ref<7> highs on lines 846', 847' flip their respective flip flops 970 and 980 to logic high ("1"). Subsequent arrivals of high Ref<0>, Ref<1>, etc. signals within one-pass run 995 may begin to flip their respective flip flops 910—etc., as well. But recall that when FF 980 switches to logic high ("1"), its Q output line 985 forces FF's 910-950 to reset. Thus, by the time the snapshot is taken at the end of one-pass run 995, the resulting latent pattern 969 is RR<7:0>=1110 ... 0000. Connection of node 975 to NOR gate 961 is not necessary here and in an alternate embodiment, the input of 961 is fixed at "0" just as is the input of NOR gate 971.

By referring to FIGS. 9A-9B it may be seen that a similar type of explanation applies for the latent pattern 979 (RR<7:0>=1100 ... 0000) generated by the 970-975 circuit section. Formation of latent pattern 989 (RR<7:0>=1000 ... 0000) has already been explained above.

Although particular forms of type-1 and type-2 one-pass runs with termination have been described above for forming the specific RR patterns 919-989, alternate and/or other back-up means for terminating the runs and generating unique RR patterns even if the type-1 and type-2 run termination processes do not work, say because the Fine Down Event signal 906 is later than 1 coarse tick in being asserted. This alternate back-up means may be described as a method of casting distant zeroes or flip-blocking and thus preserving pre-existing zeroes. Referring to circuit section 920, assume that the slate-erasing signal 906 does not come on time and that after Settled_Ref<1> goes high at time point e1, not only do Settled_Ref<2> through Settled_Ref<4> go high per legend 991 at time points e2-e4, but also that others in the consecutive series of Settled_Ref<4> through Settled_Ref<7> go high and then high ones of Settled_Ref<1> through Settled_Ref<4> reappear at time points e2'-e4' (see 801 of FIG. 8A).

In spite of this rolling-over sequence of high versions of the Settled_Ref<0> through Settled_Ref<7> signals (840'-847'), flip flops 910 and 980 are blocked from flipping to logic high ("1") at their Q outputs. This is so because node 925 connects to the inputs of NOR gates 911 and 981. As a result, the RP10 pattern of a "0" in position RR0 of latent pattern 929 and of a "1" in position RR1 of latent pattern 929 is preserved.

Analysis of FIGS. 9A-9B will show that for a similar reason the RP21 subset pattern inside main pattern 939 is preserved due to node 935 connecting to the inputs of NOR gates 921 and 981. For a similar reason the RP32 subset pattern inside main pattern 949 (FIG. 9B) is preserved due to node 945 connecting to the inputs of NOR gates 931 and 981. The RP43 subset pattern inside main pattern 959 is preserved due to node 955 connecting to the inputs of NOR gates 941 and 981. The RP54 subset pattern inside main pattern 969 is preserved due to node 965 connecting to an input of NOR gate 951. The RP65 subset pattern inside main pattern 979 is preserved due to node 975 optionally connecting to an input of NOR gate 961. The zero casting (flip blocking) technique used here casts a zero the furthest distance forward in time (i.e. from e0 to e7 as done at node 915) so that even if propagation time is long, the blockage effect will have time to take effect before the to-be-blocked logic high ("1") pulse arrives.

Although a specific pattern of flip blockings and/or forced resets (by FF 980 being set) has been described for the embodiment of FIGS. 9A-9B, it is within the contemplation of the disclosure that other sets of unique patterns may be used to indicate which Rising Ref signal rose first during a detection run. Lookup tables such as the ones shown in FIG. 11 may be used to identify the unique patterns and determine therefrom, which of the Rising Ref (or Rising FB) signals rose first during each respective detection run and also to determine the amount of fine correction, if any, to be applied in response to the identified state.

Figure 10A:
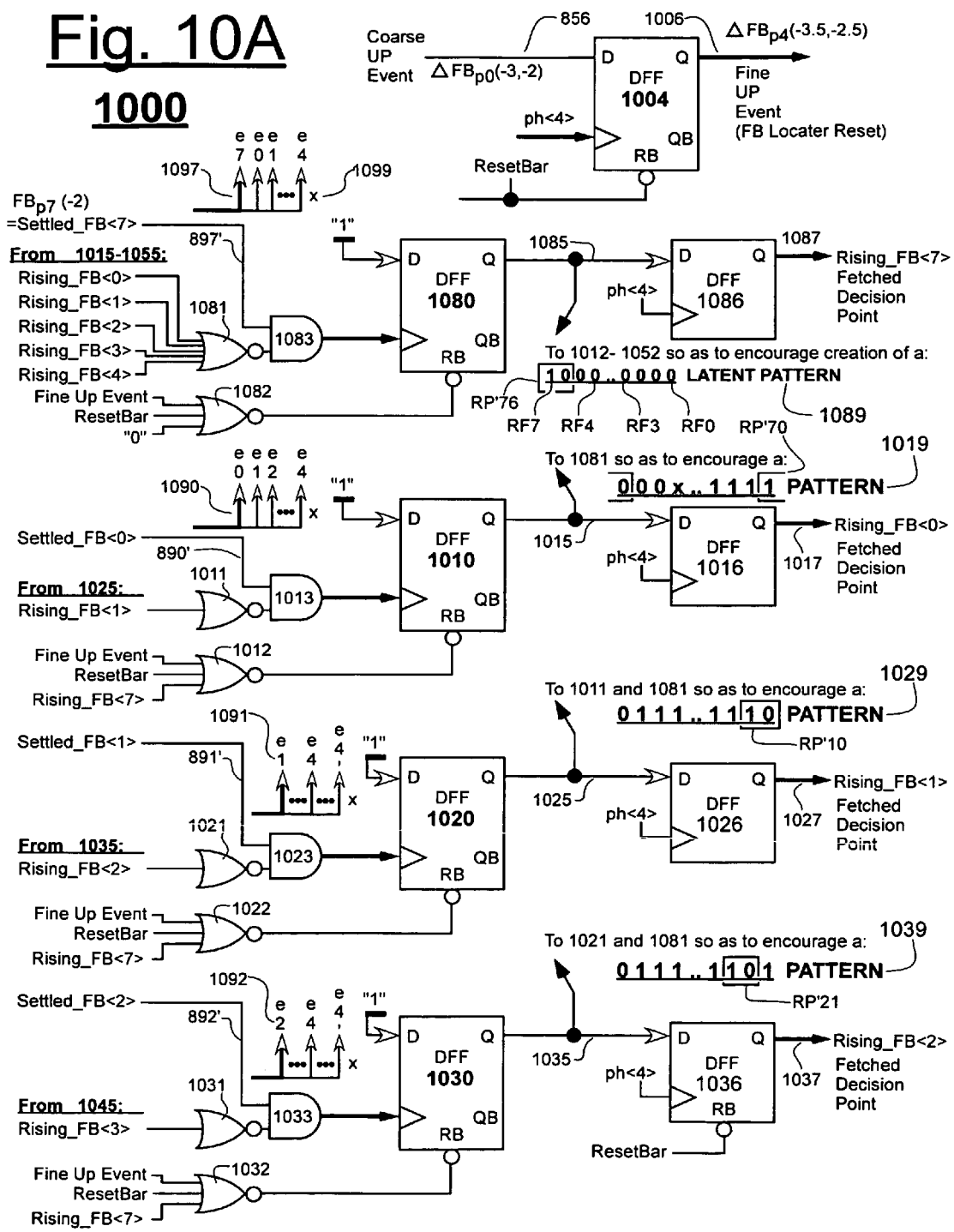

FIGS. 10A-10B shows a schematic for a circuit 1000 and 1000' that provides substantially the same function for detecting and identifying the rise times of the follower or feedback signal relative to fine time points e0-e7. For example, the FB(0) signal is applied to one input terminal (890') of AND gate 1013 for flipping register 1010 to logic high ("1") if the FB(0) signal arrives first during a detection run. Reference numbers in FIGS. 10A-10B correspond to those in FIGS. 9A-9B with the exceptions that numbers in FIGS. 10A-10B are generally in the 1000 century series and with the further exception that the feedback signal is used instead of the reference signal. As one example, it can be seen that fetched decision points 917-987 in FIGS. 9A-9B correspond to fetched decision points 1017-1087 in FIGS. 10A-10B. Thus, a further detailed explanation of FIGS. 10A-10B is not necessary and its operations may be understood from the foregoing description of FIGS. 9A-9B.

Referring to FIG. 11, a block diagram of one possible implementation 1100 for the position decoders and correction exporters (i.e., 610C of FIG. 6) is shown. Rising Ref edge locater 900" outputs the reference decision point signals 917'-987' in phase with the phase<4> clock to a front end of a Rising Ref edge decoder 1101 where that front end is also clocked by phase<4>. A pattern recognition and correction determining means (e.g., a lookup table) 1101A is provided in the edge decoder 1101 for recognizing unique aspects of the different decision point patterns and for outputting a corresponding and predefined correction signal 1151. In the illustrated example, the pattern recognizer looks for unique positionings of "10" RP sub-patterns of FIGS. 9A-9B and treats other bits as don't cares (x's). Thus, the pattern recognizer works irrespective of whether the one-pass detection run is used in block 900" or the flip-blocking technique is used instead.

In the specific implementation of FIG. 11, signed two's complement values are used to represent the correction amount, with the MSB being the sign bit. Thus the 4-bit correction amount on line 1151 can span the range −7 to +7. In the given embodiment, corrections if any, for the reference fine correction 1151 are all negative integers (or a zero) and they are output in phase with rising edges of the phase<0> clock. Referring to FIG. 3B, the reason for the negative corrections is that the Reference rising edges (e.g., 301) give rise to a Down count (331') being sent to the course counter. The coarse count for the 301-302 event pair is t2−t4; which is a negative number. The desired more accurate value is t1−t3 (which is also a negative number). To obtain the desired value of t1−t3, the following arithmetic operation may be performed:

$$t1-t3=(t1-t2)+(t2-t4)-(t3-t4) \quad \{Eq. 1\}$$

In equation Eq. 1, the fine reference correction, (t1−t2) is a negative number. The coarse count t2−t4 is also a negative number. The negation of (t3−t4) is a positive number or zero and this corresponds to the fine FB correction. This is why in the given embodiment, corrections if any, for the feedback fine correction 1161 are all positive integers (or a zero).

Referring back to FIG. 3B for another moment, the greater the timing miss is between the reference rising edge (301 at time point t1) and the rising edge of the coarse Down pulse edge (at time point t2, in phase with phase<0>), the greater the absolute magnitude of correction. Thus if reference edge 301 arrives in the interval e7→e0 (i.e., after time point e7 but just before e0) then the amount of miss is considered negligible in this embodiment and the correction amount is predefined as 0000. On the other hand, reference edge 301 arrives in the interval e6→e7 (i.e., after time point e6 but before e7), the absolute magnitude of the correction t1−t2 is considered slightly larger and the correction amount is predefined as −1 (or 1111 under conventional signed 2's complement encoding). If reference edge 301 arrives in the interval e5→e6, the correction becomes yet larger; −2 in the given example.

Adder 1152 combines the signed 4-bit correction signal 1151 for the reference signal with a 17 bit signed value signal 1153 provided by the coarse slip counter 1150. In this embodiment, the coarse slip counter 1150 is a saturating counter responsive to the coarse Up and Down signals and operating in synchronism with the phase<0> clock. In one embodiment, the coarse slip counter 1150 operates in parallel with the Ref_Edge Decoder 1101 so that the respective result signals, 1153 and 1151 are concurrently output in synchronism with one another for further processing in adder 1152. Pipeline delay registers (not shown) may be employed where appropriate for synchronizing signals such as 1153 and 1151 that are to be arithmetically or combinatorially united.

In similar fashion in FIG. 11, Rising FB edge locater 1000" outputs the feedback decision point signals 1017'-1087' in phase with the phase<4> clock to a front end of a Rising FB edge decoder 1102 where that front end is also clocked by phase<4> and the result exporting end is clock by the phase<0> edges. A pattern recognition and correction determining means (e.g., a lookup table) 1102A is provided in edge decoder 1102 for recognizing unique aspects of the different decision point patterns and for outputting a corresponding and predefined correction signal 1161 for the feedback edge position. In the illustrated example, the pattern recognizer looks for the same unique positionings of the "10" RP' sub-patterns of FIGS. 10A-10B and treats other bits as don't cares (x's). Thus, the pattern recognizer of Table 1102A can be structured the same as the pattern recognizer of first Table 1102A.

In the given embodiment, corrections if any, for forming the feedback fine correction signal 1161 are all positive integers (or a zero) and they are output in phase with rising edges of the phase<0> clock. The reason for why this is so has already been explained above. The reason for the increasing magnitudes of correction correspond to the increasing absolute magnitude of the t3-t4 factor as the fine edge position for the FB signal slips further back behind the e0 time point.

Adder 1162 combines the signed 4-bit correction signal 1161 for the feedback signal with a 20 bit subtotal result signal 1154 output from adder 1152 to thereby generate a 20 bit phase error value signal 1164 for further processing by quantization unit 1170. In one embodiment, the quantization unit 1170 includes a saturating accumulator that sums the outputs (1164) of adder 1162 from one Up pulse to the next. (See FIG. 3B.) A digital Low Pass Filter (LPF) 1175 may be provided after the quantization unit 1170 for smoothing out the correction signal 1174 before supplying the smoothed version (1178) to the variable pulse generator 530' as control signal 525' (see FIG. 6). Design of the LPF 1175 may be varied from application to application, or the LPF may be left out of the feedback loop as appropriate. In one embodiment, the coarse slip counter 1150 and/or Ref_Edge Decoder 1101 operate in parallel with the FB_Edge Decoder 1102 so that the respective result signals, 1153, 1151 and 1161 can be concurrently output in synchronism with one another for arithmetic and further processing. Pipeline delay registers (not shown) may be employed where appropriate for synchronizing signals such as 1153, 1151 and 1161 that are to be arithmetically or combinatorially united. Various different topologies may be employed other than the illustrated ones. For example, in an alternate version of FIG. 11 signal 1151 may be first arithmetically combined with signal 1161 to thereby form a composite fine correction signal, and the latter may thereafter be combined with an appropriately delayed or resynchronized version of the coarse count signal 1153. Alternatively, the quantization unit 1170 may receive signals 1151, 1161 and 1153 separately and accumulate each over time independently before combining the time-integrated values in accordance with a predetermined function.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

By way of a first example of a further modification in accordance with the disclosure, the cluster of fine markers 1223 shown in FIG. 12 does not have to be a cluster of equally-spaced fine markers. Nor do adjacent clusters have to be non-overlapping at their peripheries. The important thing is that clusters associated with respective coarse markers are consistent from coarse marker to coarse marker so that identification of the first and second fine markers associated with the respective first and second edges of the chronological displacement that is being measured can be used to correctly determine the appropriate amount of fine correction. And of course, although the disclosed embodiment of FIG. 5 generates the fine markers (e.g., phase<0> through phase<7>) and then picks each J'th one of those as the coarse marker (e.g., J=8 and phase<0> is the coarse marker), it is within the contemplation of the disclosure to generate the coarse markers first and then to align a cluster of fine markers relative to each generated coarse marker.

By way of a second example, it is within the contemplation of the disclosure to have markers of intermediate precision between timing markers of the coarsest precision and those of the finest precision. For example, for each of the coarsest timing markers, a corresponding cluster of intermediate timing markers may be generated in alignment with its respective coarsest marker; and for each of the intermediate timing markers, a corresponding sub-cluster of finer timing markers may be generated in alignment with its respective intermediate timing marker. In such a case, identification of intermediate and finer timing markers that are closest to respective edges of signals being measured can be identified concurrently and in parallel with counting of the coarsest markers separating corresponding ones of the edges so as to thereby quickly attain a precise measurement of phase difference down to the precision level of the finer timing markers.

By way of yet a further example, it is understood that the configuring of decoder tables 1101A, 1102A in FIG. 11 may be implemented as a reprogrammable function so that the patterns that-are-to-be recognized and/or the correction values (1151, 1161) that-are-to-be output may be varied from time to time. Operations of the quantization unit 1170 and/or LPF 1175 may also be made reprogrammable at run time or otherwise so as to provide for real time adaptive behavior if desired. Numerous variations of how to detect and identify the first rising edge of each detection run may occur to those skilled in the art after having seen the techniques disclosed herein. As such, it is within the scope of the disclosure to have a real time instructable or reprogrammable machine to carry out equivalents of operations disclosed herein so as to thereby provide fine phase corrections that are synchronized with, and thus combinable in real time with coarse phase determinations.

Reservation of Extra-Patent Rights, Resolution of Conflicts, and Interpretation of Terms After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise-projectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding regular meanings within the relevant technical arts and within the respective contexts of their presentations herein.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C. §120 and/or 35 U.S.C. §251.

What is claimed is:

1. A chronometer for measuring respective chronological displacements between first edges of a first switched signal and corresponding second edges of a second switched signal, the chronometer comprising:

(a) a timing marks receiver that receives a common set of chronologically spaced-apart timing markers including a set of spaced-apart coarse timing markers and including, for each coarse timing marker, a cluster of plural spaced-apart fine timing markers, where each cluster can align temporally in accordance with a predefined orientation relative to its respective coarse marker, and where at least some of the fine timing markers are temporally interposed between the coarse timing markers;

(b) a coarse locations determiner, operatively coupled to the timing marks receiver, for designating a first of the coarse timing markers as corresponding to a given first edge of the first switched signal, for designating a second of the coarse timing markers as corresponding to a given second edge of the second switched signal; and for generating therefrom a coarse displacement signal that coarsely represents a chronological displacement present between the given first and second edges of the respective first and second switched signals;

(c) a first fine location determiner, operatively coupled to the timing marks receiver, for identifying a first of the fine timing markers in the cluster of the designated first coarse timing marker as a fine marker that temporally lies at or immediately adjacent to the given first edge; and (d) a second fine location determiner, operatively coupled to the timing marks receiver, for identifying a second of the fine timing markers in the cluster of the designated second coarse timing marker as one that temporally lies at or immediately adjacent to the given second edge.

2. The chronometer of claim 1 and further comprising:
(e) one or more fine correction generators, operatively coupled to at least one of the first and second fine location determiners, for generating a corresponding one or more fine timing correction signals representing fine corrections to be added to the coarse temporal displacement signal for thereby producing a finely corrected displacement signal that represents the chronological displacement between the given first and second edges with better accuracy than that of the coarse temporal displacement signal.

3. The chronometer of claim 2 wherein:
said first switched signal is a supplied reference signal; and
said second switched signal is a follower signal generated by a variable pulse generator whose operations are responsive to the finely corrected displacement signal.

4. The chronometer of claim 2 wherein:
(cd.1) said first and second fine location determiners operate in parallel so as to thereby identify their respective ones of the first and second fine timing markers in substantially concurrent or other time-wise parallel fashion.

5. The chronometer of claim 4 wherein:
(e.1) said one or more fine correction generators operate in parallel in the case where there are at least two fine correction generators, so as to thereby produce their respective fine timing correction signals in substantially concurrent or other time-wise parallel fashion.

6. The chronometer of claim 2 wherein:
said first and second fine location determiners output pattern signals indicative of respective identifications of which of said fine timing markers in the respective clusters temporally lie at or immediately adjacent to corresponding ones of the given first and second edges; and
(e.1) said one or more fine correction generators each includes a pattern decoder for recognizing distinctions among the output pattern signals and said one or more fine correction generators each includes a respective mapping table for producing a respective one of said fine timing correction signals as a pre-mapped response to the recognized distinctions of its corresponding pattern decoder.

7. The chronometer of claim 1 wherein:
(b.1) the coarse locations determiner includes a saturating slip counter.

8. The chronometer of claim 1 wherein:
(c.1) the first fine location determiner includes a slate erasing mechanism for repeatedly wiping clean a plurality of flippable registers and a flip-blocking mechanism for blocking predefined subsets of the flippable registers from flipping after a first of the flippable registers flips immediately following a slate erasing operation.

9. The chronometer of claim 1 wherein:
(c.1) the first fine location determiner includes a detection pass terminating mechanism and a snapshot taking mechanism.

10. The chronometer of claim 1 and further comprising:
(e) a course timing marks generator for generating and supplying the spaced-apart coarse timing markers to the timing marks receiver, the coarse timing marks generator including coarse marker spacing means for causing the coarse timing markers to be equally spaced-apart from one another by a pre-defined coarse chronological spacing.

11. The chronometer of claim 1 and further comprising:
(e) a fine timing marks generator for generating and supplying the spaced-apart fine timing markers to the timing marks receiver, the fine timing marks generator including fine marker spacing means for causing the fine timing markers of each cluster to be equally spaced-apart from one another by a pre-defined fine chronological spacing.

12. The chronometer of claim 1 and further comprising:
(e) a fine-to-coarse aligning means for causing said clusters of fine markers to align temporally in accordance with one or more predefined orientations relative to their respective coarse markers.

13. The chronometer of claim 12 wherein:
(e.1) the fine-to-coarse aligning means causes each cluster of fine markers to align temporally in an essentially identical manner to its respective coarse marker.

14. The chronometer of claim 1 and further comprising:
(e) a consistent timing marks generator for generating and supplying the spaced-apart fine timing markers to the timing marks receiver, the fine timing marks generator including a substantially invariant oscillator for causing temporal spacings between the fine timing markers of each cluster to be consistent over a predefined operating temperature range.

15. The chronometer of claim 1 wherein:
(c.1) the first fine location determiner includes a sampling history logger for sampling the first switched signal at sampling time points defined by the fine timing markers in the cluster of a corresponding first coarse timing marker and for registering the sampling results.

16. The chronometer of claim 15 wherein:
(c.2) the first fine location determiner includes a samples stabilizer coupled to the sampling history logger for allowing the registered samples to settle into stabilized states.

17. The chronometer of claim 16 wherein:
(c.3) signal propagation delay through the sampling history logger and through the samples stabilizer is essentially identical for each of the samples taken of the first switched signal at said sampling time points.

18. The chronometer of claim 1 wherein:
said coarse locations determiner, first fine location determiner, and second fine location determiner operate concurrently.

19. A method of measuring respective chronological displacements between first edges of a first switched signal and corresponding second edges of a second switched signal, the method comprising:
(a) receiving a set of chronologically spaced-apart timing signals including a set of spaced-apart coarse timing markers and for each coarse timing marker, a cluster of spaced-apart fine timing markers, where each cluster can align temporally in accordance with a predefined orientation relative to its respective coarse marker, and where upon alignment at least some of the fine timing markers are temporally interposed between the coarse timing markers;
(b) first designating a first of the coarse timing markers as corresponding to a given first edge of the first switched signal;

(c) second designating a second of the coarse timing markers as corresponding to a given second edge of the second switched signal;

(d) in response to said first and second designating steps, (b) and (c), generating a coarse displacement signal that coarsely represents a chronological displacement present between the given first and second edges of the respective first and second switched signals;

(e) first identifying a first of the fine timing markers in the cluster of the designated first coarse timing marker as a fine marker that temporally lies at or immediately adjacent to the given first edge; and (f) second identifying a second of the fine timing markers in the cluster of the designated second coarse timing marker as one that temporally lies at or immediately adjacent to the given second edge.

20. The measuring method of claim 19 and further comprising:

(g) in response to one or more of the first and second identifying steps (e) and (f), generating a corresponding one or more fine timing correction signals representing fine corrections to be added to the coarse temporal displacement signal for thereby producing a finely corrected displacement signal that represents the chronological displacement between the given first and second edges with better accuracy than that of the coarse temporal displacement signal.

21. The measuring method of claim 20 wherein:
said first switched signal is a supplied reference signal; and
said second switched signal is a follower signal generated by a variable pulse generator;
the method further comprising:

(h) varying operations of the variable pulse generator in response to the finely corrected displacement signal.

22. The measuring method of claim 20 wherein:
(ef.1) said first and second fine identifying steps occur in parallel-operating fine position determining circuits so as to thereby identify their respective ones of the first and second fine timing markers.

23. The measuring method of claim 20 wherein:
(g.1) in the case where at least two fine correction signals are generated, said generating of the one or more fine correction signals occurs by way of parallel generating paths.

24. The measuring method of claim 20 wherein:
said first and second identifying steps output pattern signals indicative of respective identifications of which of said fine timing markers in the respective clusters temporally lie at or immediately adjacent to corresponding ones of the given first and second edges; and
(g.1) said step (g) of generating a corresponding one or more fine timing correction signals includes decoding the output pattern signals so as to thereby recognize distinctions among the output pattern signals and mapping the decodings of the output pattern signals to respective and predefined fine timing correction signal magnitudes.

25. The measuring method of claim 19 wherein:
(d.1) said generating a coarse displacement signal includes using a saturating slip counter to coarsely count off a number of coarse markers present between the given first and second edges of the respective first and second switched signals.

26. The measuring method of claim 19 wherein:
(e.1) said first identifying of a first of the fine timing markers includes repeatedly wiping clean a plurality of flippable registers and employing a flip-blocking mechanism for blocking predefined subsets of the flippable registers from flipping after a first of the flippable registers flips immediately following a slate cleaning operation.

27. The measuring method of claim 19 wherein:
(e.1) said first identifying of a first of the fine timing markers includes terminating a detection run that detects first transitions along a time scale of the fine timing markers and taking a snapshot of the terminated detection run.

28. The measuring method of claim 19 and further comprising:
(g) generating the spaced-apart coarse timing markers so as to be equally spaced-apart from one another by a predefined coarse chronological spacing.

29. The measuring method of claim 19 and further comprising:
(g) generating the fine timing markers of each cluster so as to be equally spaced-apart from one another by a predefined fine chronological spacing.

30. The measuring method of claim 19 and further comprising:
(g) causing the clusters of fine markers to align temporally in accordance with one or more predefined orientations relative to their respective coarse markers.

31. The measuring method of claim 30 wherein:
(g.1) said causing of temporal alignment includes causing each of the clusters of fine markers to align temporally in an essentially identical manner to its respective coarse marker.

32. The measuring method of claim 19 wherein:
(e.1) said step of (e) first identifying includes sampling the first switched signal at sampling time points defined by the fine timing markers in the cluster of a corresponding first coarse timing marker and registering the sampling results.

33. The measuring method of claim 32 wherein:
(e.2) said step of (e) first identifying includes delaying the registered sampling results by at least one coarse sampling interval so as to thereby allow the registered samples to settle into stable discrete states.

34. The measuring method of claim 33 wherein:
(e.3) said delaying of the registered sampling results is essentially identical for each of the samples taken of the first switched signal at said sampling time points.

35. The measuring method of claim 19 wherein:
said steps of generating the coarse displacement signal and of identifying the first of the fine timing markers and of identifying the second of the fine timing markers occur by operation of parallel signal generating circuits.

36. A phase difference detector comprising:
(a) a first fine edge locater for determining a first phase relation between a supplied first switching signal and a supplied plurality of finely out-of phase clock signals;
(b) a second fine edge locater for determining a second phase relation between a supplied second switching signal and the supplied plurality of finely out-of phase clock signals; and
(c) a fine displacement determiner, responsive to the first and second fine edge locaters and receiving coarse marker signals which can be used to designate coarse timings of respective switching edges of the first and second switching signals, the fine displacement determiner providing one or more indications of fine phase differences between the switching edges of the first and second switching signals and respective ones of the coarse marker signals.

37. The phase difference detector of claim 36 and further comprising:
(d) a coarse difference determiner, operating in parallel with and in synchronism with the fine edge locaters as well as in synchronism with the coarse marker signals and providing an indication of a coarse phase difference between corresponding switching edges of the first and second switching signals.

38. The phase difference detector of claim 37 wherein:
said indication of the coarse phase difference temporally aligns with the said one or more indications of the fine phase differences so the coarse and fine indications can be arithmetically combined to thereby provide a more accurate, total phase difference indication for representing phase displacement between corresponding switching edges of the first and second switching signals.

39. The phase difference detector of claim 36 and further comprising:
(d) a fine phases generator for generating a plurality of finely out-of phase clock signals for thereby supplying said plurality of finely out-of phase clock signals.

40. The phase difference detector of claim 39 wherein:
(d.1) said fine phases generator includes a delay locked loop (DLL).

41. The phase difference detector of claim 40 wherein:
(d.2) said DLL locks into phase with a frequency regulated clock signal.

42. The phase difference detector of claim 39 wherein:
(d.1) said fine phases generator includes a frequency divider.

* * * * *